US011658660B1

(12) United States Patent
Finck et al.

(10) Patent No.: US 11,658,660 B1
(45) Date of Patent: May 23, 2023

(54) MULTIMODE COUPLER TO CONTROL INTERACTION BETWEEN QUANTUM BITS

(71) Applicant: International Business Machines Corporation, Armonk, NY (US)

(72) Inventors: Aaron Finck, White Plains, NY (US); John Blair, Katonah, NY (US); George Andrew Keefe, Cortlandt Manor, NY (US); Muir Kumph, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/848,903

(22) Filed: Jun. 24, 2022

(51) Int. Cl.
*H03K 17/92* (2006.01)

(52) U.S. Cl.
CPC ............. *H03K 17/92* (2013.01); *H10N 60/12* (2023.02)

(58) Field of Classification Search
CPC ............................... H03K 17/92; H10N 60/12
USPC ........................................................ 327/133
See application file for complete search history.

(56) References Cited

U.S. PATENT DOCUMENTS

| | | | |
|---|---|---|---|
| 9,685,935 B2 | 6/2017 | Strand et al. | |
| 10,374,612 B1 * | 8/2019 | Sinclair | H01L 29/127 |
| 10,467,544 B2 | 11/2019 | Filipp et al. | |
| 10,572,816 B1 | 2/2020 | Vavilov et al. | |
| 10,573,685 B1 | 2/2020 | Adiga et al. | |
| 10,957,737 B2 | 3/2021 | Adiga et al. | |
| 2017/0193388 A1 | 7/2017 | Filipp et al. | |
| 2021/0182728 A1 | 6/2021 | Neill et al. | |
| 2021/0406746 A1 | 12/2021 | Stehlik et al. | |
| 2021/0408112 A1 | 12/2021 | Finck et al. | |
| 2021/0408113 A1 | 12/2021 | Finck et al. | |

OTHER PUBLICATIONS

L. Ding et al., "Microwave Activated Two-Qubit Gate for Fluxonium Qubits via a Tunable-Transmon Coupler," Bulletin of the American Physical Society, Abstract only, Mar. 14-18, 2022, 2 pages.
I. N. Moskalenko et al., "Tunable Coupling Scheme for Implementing Two-Qubit Gates on Fluxonium Qubits," Applied Physics Letters, arXiv:2107.11550v2, Sep. 26, 2021, 14 pages.

(Continued)

*Primary Examiner* — Tomi Skibinski
(74) *Attorney, Agent, or Firm* — Erik Johnson; Ryan, Mason & Lewis, LLP

(57) ABSTRACT

A device comprises first and second qubits, and a qubit coupler coupled between the first and second qubits. The second qubit comprises first and second modes with the first mode configured to store data. The qubit coupler comprises first and second modes, and operates in a first state or second state. In the first state, the first qubit is exchange coupled to the first mode of the qubit coupler, and the second mode of the second qubit is exchange coupled to the second mode of the qubit coupler, to suppress interaction between the first and second qubits. In the second state, the first qubit and the first mode of the second qubit are exchange coupled to both the first and second modes the qubit coupler, to enable interaction between the first and second qubits for an entanglement gate operation in response to a control signal applied to the qubit coupler.

20 Claims, 16 Drawing Sheets

(56) References Cited

OTHER PUBLICATIONS

K. N. Nesterov et al., "Proposal for Entangling Gates on Fluxonium Qubits via a Two-Photon Transition," PRX Quantum vol. 2, No. 020345, Jun. 22, 2021, 15 pages.
A. D. K. Finck et al., "Suppressed Crosstalk Between Two-Junction Superconducting Qubits with Mode-Selective Exchange Coupling," Physical Review Applied, arXiv:2105.11495v2, Nov. 22, 2021, 7 pages.
H. Paik et al., "Experimental Demonstration of a Resonator-Induced Phase Gate in a Multi-Qubit Circuit QED System," Physical Review Letters, arXiv:1606.00685v1, Jun. 2, 2016, 13 pages.
Q. Ficheux et al., "Fast Logic with Slow Qubits: Microwave-Activated Controlled-Z gate on Low-Frequency Fluxoniums," Physical Review X, arXiv:2011.02634v1, Nov. 5, 2020, 17 pages.
H. S. Ku et al., "Qubit Gates Using Hyperbolic Secant Pulses," Physical Review A, arXiv:1704.00803v2, Apr. 5, 2017, 5 pages.
C. Chamberland et al., "Topological and Subsystem Codes on Low-degree Graphs with Flag Qubits," Physical Review X, vol. 10, No. 011022, Jan. 31, 2020, 19 pages.
J. M. Kreikebaum et al., "Improving Wafer-scale Josephson Junction Resistance Variation in Superconducting Quantum Coherent Circuits," Superconductor Science and Technology, vol. 33, No. 6, Apr. 29, 2020, 6 pages.
J. Stehlik et al., "Tunable Coupling Architecture for Fixed-Frequency Transmons," arXiv:2101.07746v1, Jan. 19, 2021, 7 pages.
P. Mundada et al., "Suppression of Qubit Crosstalk in a Tunable Coupling Superconducting Circuit," Physical Review Applied, arXiv:1810.04182v2, May 31, 2019, 11 pages.
B. Foxen et al., "Demonstrating a Continuous Set of Two-Qubit Gates for Near-Term Quantum Algorithms," Physical Review Letters, vol. 125, Sep. 15, 2020, 6 pages.
J. Stehlik et al., "Tunable Coupling Architecture for Fixed-frequency Transmon Superconducting Qubits," Physical Review Letters, vol. 127, Aug. 20, 2021, 6 pages.
F. Yan et al., "A Tunable Coupling Scheme for Implementing High-fidelity Two-Qubit Gates," Physical Review Applied, arXiv:1803.09813v1, Mar. 26, 2018, 10 pages.
M. Steffen et al., "Shaped Pulses for Quantum Computing," Physical Review A, vol. 75, No. 062326, Jun. 21, 2007, 4 pages.
P. Mell et al., "The NIST Definition of Cloud Computing," Recommendations of the National Institute of Standards and Technology, Special Publication 800-145, Sep. 2011, 7 pages.
C. K. Andersen et al., "Entanglement Stabilization Using Ancilla-Based Parity Detection and Real-Time Feedback in Superconducting Circuits," NPJ Quantum Information, Aug. 15, 2019, pp. 1-7, vol. 5, No. 1.
B. Criger et al., "Quantum Error Correction with Mixed Ancilla Qubits," Physical Review A, arXiv:1201.1517v2, Mar. 8, 2012, 5 pages.
A. Kandala et al., "Demonstration of a High-Fidelity CNOT Gate for Fixed-Frequency Transmons with Engineered ZZ Suppression," Physical Review Letters, arXiv:2011.07050v1, Nov. 13, 2020, 10 pages.
P. Zhao et al., "Quantum Crosstalk Analysis for Simultaneous Gate Operations on Superconducting Qubits," PRX Quantum, Apr. 1, 2022, 21 pages, vol. 3, No. 020301.

\* cited by examiner

300

400

500

600

700

800

1010

1020

1070

1080

MULTIMODE COUPLER TO CONTROL INTERACTION BETWEEN QUANTUM BITS

BACKGROUND

This disclosure relates generally to superconducting quantum computing and, in particular, superconducting quantum systems and devices that are implemented using superconducting quantum bits (qubits). A superconducting quantum computing system is implemented using circuit quantum electrodynamics (QED) devices, which utilize the quantum dynamics of electromagnetic fields in superconducting circuits, which include superconducting qubits, to generate and process quantum information. In general, superconducting qubits are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures. A qubit can be effectively operated as a two-level system using a ground state and first excited state of the qubit due to the anharmonicity imparted by a non-linear inductor element (e.g., Josephson inductance) of the qubit, which allows the ground and first-excited states to be uniquely addressed at a transition frequency of the qubit, without significantly disturbing the higher-excited states of the qubit.

Various types of quantum information processing operations can be implemented using a superconducting quantum processor which comprises multiple superconducting qubits, wherein the superconducting qubits can be coherently controlled, placed into quantum superposition states (via, e.g., single-gate operations), exhibit quantum interference effects, and become entangled with one another (via, e.g., entanglement gate operations). The fidelity of quantum gate operations can be adversely impacted by unwanted crosstalk (e.g., residual static ZZ interactions) between adjacent superconducting qubits. For example, unwanted crosstalk between superconducting qubits can cause the transition frequency of one superconducting qubit to be dependent on the state of one or more neighboring superconducting qubits. As quantum processors are scaled with increasing numbers of superconducting qubits and higher integration densities, such unwanted crosstalk becomes increasingly problematic.

SUMMARY

Exemplary embodiments of the disclosure include quantum devices that are configured to control interaction (e.g., ZZ interaction) between coupled superconducting quantum bits.

An exemplary embodiment includes a device which comprises a first superconducting quantum bit, a second superconducting quantum bit, and a superconducting quantum bit coupler. The second superconducting quantum bit comprises a first mode and a second mode, wherein the first mode is configured to store quantum data. The superconducting quantum bit coupler is coupled between the first superconducting quantum bit and the second superconducting quantum bit. The superconducting quantum bit coupler comprises a first mode and a second mode, and is configured to operate in one of a first state and a second state in response to a control signal applied to the superconducting quantum bit coupler. In the first state of the superconducting quantum bit coupler, the first superconducting quantum bit is exchange coupled to the first mode of the superconducting quantum bit coupler, and the second mode of the second superconducting quantum bit is exchange coupled to the second mode of the superconducting quantum bit coupler, to suppress interaction between the first superconducting quantum bit and the first mode of the second superconducting quantum bit. In the second state of the superconducting quantum bit coupler, the first superconducting quantum bit and the first mode of the second superconducting quantum bit are exchange coupled to both the first mode and the second mode of the superconducting quantum bit coupler, to enable interaction between the first superconducting quantum bit and the first mode of the second superconducting quantum bit and perform an entanglement gate operation in response to the control signal applied to the superconducting quantum bit coupler.

Advantageously, the coupling of the first and second superconducting quantum bits using a superconducting quantum bit coupler, which comprise two distinct modes of excitation, allows for the simultaneous suppression of both static ZZ interactions and exchange interactions between the first and second superconducting quantum bits in instances where the superconducting quantum bit coupler is in a state in which a mode-selective exchange coupling is enforced where the first and second superconducting quantum bits are exchange coupled to the different modes of the superconducting quantum bit coupler. Such mode-selective exchange coupling results in substantially zero interaction between the first and second superconducting quantum bits. In addition, the mode-selective exchange coupling serves to suppress spectator effects between the superconducting quantum bit coupler and a remote superconducting quantum bit.

Another exemplary embodiment includes a system which comprises a quantum processor, and a control system. The quantum processor comprises an array of superconducting quantum bits. The control system is configured to generate control signals to control the quantum processor. The array of superconducting quantum bits comprises a first superconducting quantum bit, a second superconducting quantum bit, and a superconducting quantum bit coupler. The second superconducting quantum bit comprises a first mode and a second mode, wherein the first mode is configured to store quantum data. The superconducting quantum bit coupler is coupled between the first superconducting quantum bit and the second superconducting quantum bit. The superconducting quantum bit coupler comprises a first mode and a second mode, and is configured to operate in one of a first state and a second state in response to a control signal applied to the superconducting quantum bit coupler. In the first state of the superconducting quantum bit coupler, the first superconducting quantum bit is exchange coupled to the first mode of the superconducting quantum bit coupler, and the second mode of the second superconducting quantum bit is exchange coupled to the second mode of the superconducting quantum bit coupler, to suppress interaction between the first superconducting quantum bit and the first mode of the second superconducting quantum bit. In the second state of the superconducting quantum bit coupler, the first superconducting quantum bit and the first mode of the second superconducting quantum bit are exchange coupled to both the first mode and the second mode of the superconducting quantum bit coupler, to enable interaction between the first superconducting quantum bit and the first mode of the second superconducting quantum bit and perform an entanglement gate operation in response to the control signal applied to the superconducting quantum bit coupler.

Another exemplary embodiment includes a computer program product for calibrating an entanglement gate process. The computer program product comprises one or more computer readable storage media, and program instructions collectively stored on the one or more computer readable storage media. The program instructions comprise program instructions to calibrate parameters of a control pulse that is configured to control operation of a superconducting quantum bit coupler to perform an entanglement gate operation between a first superconducting quantum bit and a second superconducting quantum bit, which are coupled to the superconducting quantum bit coupler. The program instructions to calibrate the parameters of a control pulse comprise program instructions to perform an iterative process. The iterative process comprises one or more iterations of performing an amplitude calibration process and performing a frequency detuning calibration process. The amplitude calibration process is performed to calibrate an amplitude of the control pulse to cause the superconducting quantum bit coupler to rotate from a ground state, to a first excited state, and back to the ground state, in response to applying the control pulse with the calibrated amplitude to the superconducting quantum bit coupler. The frequency detuning calibration process is performed to calibrate a detuning of a frequency of the control pulse with respect to an operating frequency of the superconducting quantum bit coupler to achieve a target conditional rotation of the first superconducting quantum bit and the second superconducting quantum bit, in response to applying the control pulse with the calibrated amplitude and calibrated frequency detuning, to the superconducting quantum bit coupler.

Advantageously, an exemplary entanglement gate calibration process provides a precise and efficient method for calibrating a control pulse for two-quantum bit conditional gate operation, where the calibration process can be configured to separately calibrate the control pulse shape to cause the superconducting quantum bit coupler to go through full $2\pi$ X-axis rotation with high accuracy, regardless of the detuning between the control pulse and a mode frequency of the superconducting quantum bit coupler. The pulse detuning is then calibrated separately to achieve a desired conditional Z rotation of the first and second superconducting quantum bits. The process of iteratively repeating the separate detuning and amplitude calibration stages allows the entanglement gate calibration process to progressively achieve higher fidelity.

Other embodiments will be described in the following detailed description of exemplary embodiments, which is to be read in conjunction with the accompanying figures.

BRIEF DESCRIPTION OF THE DRAWINGS

FIGS. 10A, 10B, 10C, 10D, 10E, 10F, 10G, 10H, and 10I depict time-dependent numerical simulation results of an exemplary entanglement gate calibration process that is performed using a control pulse calibrated using the process of FIG. 9, according to an exemplary embodiment of the disclosure, wherein:

FIG. 10A comprises a waveform diagram of calibrated control pulse which is generated using an entanglement gate calibration process, according to an exemplary embodiment of the disclosure;

FIG. 10B is a timing diagram which illustrates a state projection of a superconducting multimode coupler, when the superconducting multimode coupler is driven with the calibrated control pulse with a control qubit in a ground state, according to an exemplary embodiment of the disclosure;

FIG. 10C is a timing diagram which illustrates a state projection of the superconducting multimode coupler, when the superconducting multimode coupler is driven with the calibrated control pulse with the control qubit in an excited state, according to an exemplary embodiment of the disclosure;

FIG. 10D is a timing diagram which illustrates a state projection of a target qubit, when the superconducting multimode qubit coupler is driven with the calibrated control pulse, with the control qubit in a ground state, according to an exemplary embodiment of the disclosure;

FIG. 10E is a timing diagram which illustrates a state projection of the target qubit, when the superconducting multimode qubit coupler is driven with the calibrated control pulse with the control qubit in an excited state, according to an exemplary embodiment of the disclosure;

FIG. 10F is a timing diagram which illustrates a state projection of the control qubit, when the superconducting multimode qubit coupler is driven with the calibrated control pulse with the control qubit in the ground state, according to an exemplary embodiment of the disclosure;

FIG. 10G is a timing diagram which illustrates a state projection of the control qubit, when the superconducting multimode qubit coupler is driven with the calibrated control pulse with the control qubit in the excited state, according to an exemplary embodiment of the disclosure;

FIG. 10H is a timing diagram which illustrates a conditional rotation that is obtained for the target qubit bit in response to driving the superconducting multimode qubit coupler with the calibrated control pulse, according to an exemplary embodiment of the disclosure; and FIG. 10I is a timing diagram which illustrates a concurrence of an amount of entanglement that is obtained when the superconducting multimode qubit coupler is driven with the calibrated control pulse to perform an entanglement gate operation, according to an exemplary embodiment of the disclosure.

DETAILED DESCRIPTION

Figure 1:
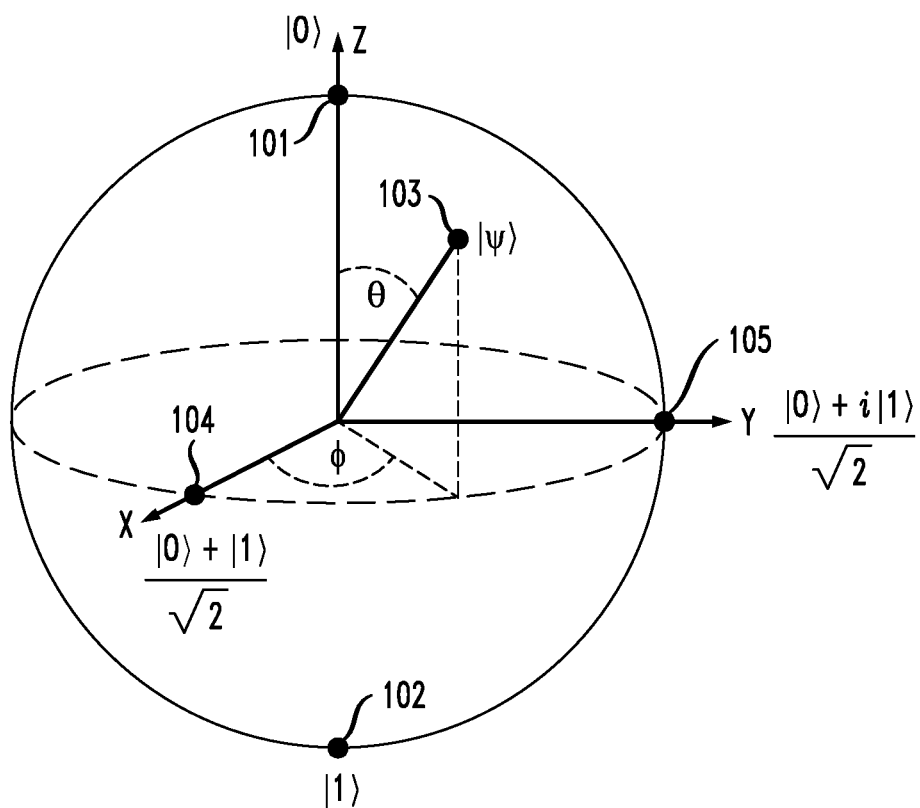
FIG. 1 depicts a Bloch sphere which graphically represents various states of a quantum bit.

Exemplary embodiments of the disclosure will now be described in further detail with regard to quantum devices that are configured to control interaction (e.g., ZZ interaction) between coupled superconducting qubits. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum bits, coupler circuitry, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

As is known in the art, quantum computing provides a computing paradigm which utilizes fundamental principles of quantum mechanics to perform computations. Quantum computing algorithms and applications are defined using quantum circuits. A quantum circuit is a computational routine which defines coherent quantum operations that are performed on quantum data that is stored in quantum bits, in conjunction with operations that are performed using classical computation. Quantum circuits are utilized to define complex algorithms and applications in an abstract manner, which can be executed on a quantum computer. In a quantum computer, primitive operations comprise gate operations (e.g., single-qubit gate operations, two-qubit gate operations, multi-qubit gate operations (e.g., 3 or more qubits) that are applied to qubits, to perform quantum computing operations for a given application. The quantum circuits allow a quantum computer to receive classical data, perform quantum operations based on the received data, and output a classical solution.

A single qubit can have a basis state of $|0\rangle$ or $|1\rangle$, or a linear combination of such basis states, which is known as a superposition state. As is known in the art, the state of a qubit can be graphically represented as a point on unit sphere (radius=1), which is called the Bloch sphere, such as illustrated in FIG. 1. In particular, FIG. 1 illustrates an exemplary Bloch sphere 100 in which the basis states $|0\rangle$ or $|1\rangle$ of a qubit are represented along the Z-axis of the Bloch sphere 100, wherein a point 101 on the positive Z-axis represents the ground state $|0\rangle$, and a point 102 on the negative Z-axis represents a first excited state $|1\rangle$ of the qubit. A superposition state $|\psi\rangle$ of the qubit can be represented as a point on the Bloch sphere as follows:

$$|\psi\rangle = \cos\frac{\theta}{2}|0\rangle + e^{i\phi}\sin\frac{\theta}{2}|1\rangle,$$

where the terms $$\cos\frac{\theta}{2}$$

and $$\sin\frac{\theta}{2}$$

corresponds to the amplitude probabilities associated with the respective states $|0\rangle$ and $|1\rangle$, and wherein the term $e^{i\phi}$ corresponds to a relative phase between the states $|0\rangle$ and $|1\rangle$. The position of a point 103 (representing a superposition state of a qubit) is determined based on the angles $\theta$ and $\phi$. The angle $\theta$ influences the probability of observing a qubit state of $|0\rangle$ or $|1\rangle$ when the qubit is read, wherein the probability of reading a qubit state of $|1\rangle$ increases as $\theta$ increases. The angle $\phi$ influences the relative phase between the states $|0\rangle$ and $|1\rangle$. For example, when $\theta=0$, the qubit is in the ground state $|0\rangle$, which provides a 100% probability of observing a qubit state of $|0\rangle$ when the qubit state is read. In addition, when $\theta=\pi$, the qubit is in the first excited state

|1⟩ , which provides a 100% probability of observing a qubit state of |1⟩ when the qubit state is read. On the other hand, when $$\theta = \frac{\pi}{2}$$

and ϕ=0, the qubit is in the state at point 104, and when $$\theta = \frac{\pi}{2}$$

and $$\phi = \frac{\pi}{2},$$

the qubit is in the state at point 105. When the qubit is in a superstition state represented by, e.g., points 104 and 105, there is a 50% probability of observing a qubit state of |1⟩ , and a 50% probability of observing a qubit state of |0⟩ , when the qubit state is read.

The state of a qubit can be changed by applying a single-qubit gate operation to the qubit, which causes the current state of the qubit to rotate around, e.g., the X-axis, Y-axis, and/or Z-axis, etc., depending on the given gate operation. A rotation about the Z-axis results in a change in the angle ϕ. In addition, qubits can be controlled using entanglement gate operations to entangle the states of two or more qubits and, thereby, generate a combined state of two or more qubits which contains more information than the individual states of the qubits.

As noted above, a superconducting quantum computing system can be implemented using superconducting qubits. For example, a superconducting transmon (transmission line shunted plasma oscillation) qubit is a type of superconducting qubit comprising a superconducting tunnel junction device (e.g., Josephson junction) connected in parallel with a capacitor. The Josephson junction functions as a non-linear inductor which, when shunted with a capacitor, forms an anharmonic oscillator with individually addressable energy levels (e.g., two lowest energy level corresponding to the ground state |0⟩ and the first excited state |1⟩ ). The transmon qubit is widely used in superconducting quantum computing, as transmon qubits provide good coherence times, and have relatively simple structures that facilitate coupling with other superconducting circuit elements, and qubit readout, etc. To control and readout the qubit, one can design the structures to capacitively or inductively couple the transmon qubits to other circuit elements, including microwave and flux drive lines, readout resonators, and couplers.

In addition, transmon qubits can be designed to have a relatively high anharmonic spectrum, in which the frequency separation between the computational states and the non-computational states, is relatively high, allowing efficient use of a superconducting transmon qubit as a two-level quantum system. In particular, as is known in the art, the operating frequency (alternatively, transition frequency) of a superconducting qubit is the frequency that corresponds to a difference in the energy between the ground state |0⟩ and the first excited state |1⟩ of the qubit. With superconducting qubits, while higher energy levels are available for a given qubit (e.g., |2⟩ , |3⟩ , etc.), the quantum system is designed to isolate the two lowest energy levels (i.e., ground state |0⟩ and first excited state |1⟩ ) of the superconducting qubits, and thereby utilize each superconducting qubit as a basic two-level system for quantum computation, while ignoring higher energy states. The term "anharmonicity" as used herein refers to a difference between (i) the frequency ($f_{01}$) to transition from the ground state |0⟩ to the first excited state |1⟩ and (ii) the frequency ($f_{12}$) to transition from first excited state |1⟩ to the second excited state |2⟩ , of the qubit.

Figure 2A:
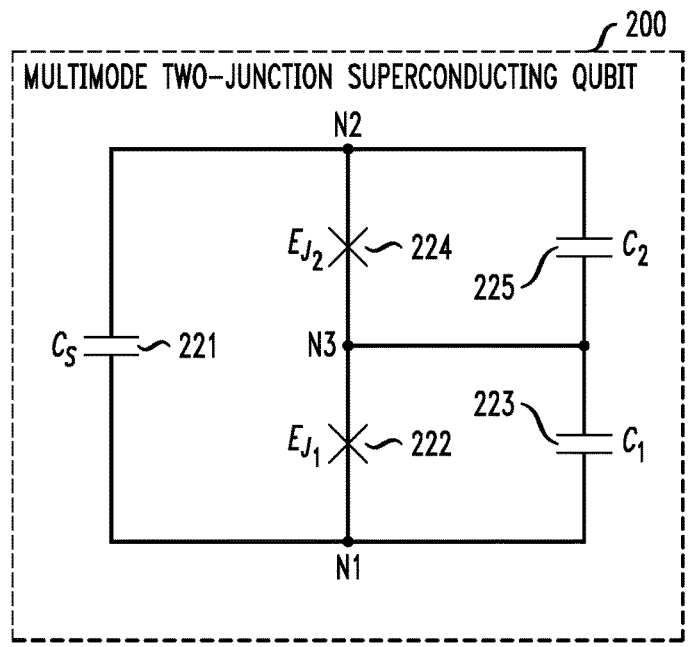
FIGS. 2A and 2B schematically illustrate a multimode, two-junction superconducting quantum bit which is utilized to implement a superconducting multimode quantum bit coupler, according to an exemplary embodiment of the disclosure.
Figure 2B:
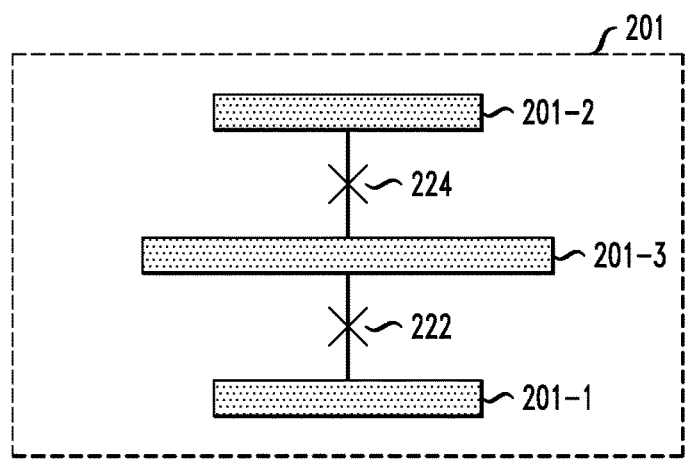

Another type of superconducting qubit that can be utilized to implement a quantum system includes a multimode two-junction superconducting qubit architecture, such as schematically illustrated in FIGS. 2A and 2B. More specifically, FIG. 2A is a schematic lumped-element circuit representation of a multimode two-junction superconducting qubit 200, which is alternatively referred to as a superconducting tunable coupler qubit (TCQ). The multimode two-junction superconducting qubit 200 comprises a shunt capacitor 221, and two capacitively-shunted superconducting tunnel junctions (e.g., Josephson junctions) connected in series between a first node N1 and a second node N2 of the multimode two-junction superconducting qubit 200, wherein a first capacitively-shunted Josephson junction comprises a first Josephson junction 222 and a first capacitor 223, and wherein a second capacitively-shunted Josephson junction comprises a second Josephson junction 224 and a second capacitor 225. The shunt capacitor 221 has a capacitance Cs, the first Josephson junction 222 has a Josephson energy En, the second Josephson junction 224 has a Josephson energy $E_{j2}$, the first capacitor 223 has a capacitance $C_1$, and the second capacitor 225 has a capacitance $C_2$. The two capacitively-shunted superconducting Josephson junctions are coupled to a middle node N3.

Next, FIG. 2B schematically illustrates a planar circuit configuration of the multimode two-junction superconducting qubit 200 of FIG. 2A, according to an exemplary embodiment of the disclosure. More specifically, FIG. 2B schematically illustrates a planar multimode two-junction superconducting qubit 201 comprising a first superconducting pad 201-1, a second superconducting pad 201-2, a third (middle) superconducting pad 201-3, wherein the first Josephson junction 222 is coupled between the first and third superconducting pads 201-1 and 201-3, and the second Josephson junction 224 is coupled between the second and third superconducting pads 201-2 and 201-3.

In this configuration, the superconducting pads 201-1, 201-2, and 201-3 comprise planar capacitor electrodes which form coplanar parallel-plate capacitor structures. For example, in the exemplary configuration of FIG. 2B, the first and second superconducting pads 201-1 and 201-2 comprise planar capacitor electrodes of the shunt capacitor 221 of FIG. 2A. In addition, the first and third superconducting pads 201-1 and 201-3 comprise planar capacitor electrodes of the first capacitor 223 of FIG. 2A, and the second and third superconducting pads 201-2 and 201-3 comprise planar capacitor electrodes of the second capacitor 225 of FIG. 2A. The first, second, and third superconducting pads 201-1, 201-2, and 201-3 correspond, respectively, to the first, second, and third nodes N1, N2, and N3 in FIG. 2A.

Figure 2C:
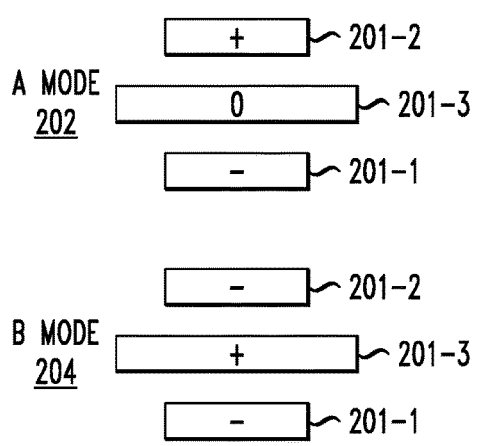
FIG. 2C schematically illustrates two distinct modes of excitations of a multimode, two-junction superconducting quantum bit, according to an exemplary embodiment of the disclosure.

The multimode two-junction superconducting qubit 201 comprises two modes of excitations with distinct frequencies and spatial symmetries. More specifically, the multimode two-junction superconducting qubit 201 comprises two distinct modes of excitation corresponding to symmetric and antisymmetric combinations of excitations associated with the two junctions, wherein the two distinct, normal modes include (i) a low-frequency "bright" mode (referred to herein as A mode) which comprises a non-zero dipole moment, and (ii) a high-frequency "dark" mode (referred to herein as B mode) which lacks a dipole moment and does not couple to external fields. FIG. 2C schematically illustrates the two distinct modes of excitations of the multimode two-junction superconducting qubit 201 of FIG. 2B, in which the "bright" mode is depicted as an A mode 202, and the "dark" mode is depicted as a B mode 204.

As schematically shown in FIG. 2C, the A mode 202 comprises a charge pattern in which, at any given point in time, the first and second superconducting pads 201-1 and 201-2 have opposite charge, and the third (middle) superconducting pad 201-3 has a net zero charge. On the other hand, the B mode 204 comprises a charge pattern in which, at any given point in time, the first and second superconducting pads 201-1 and 201-2 have the same charge, and the third (middle) superconducting pad 201-3 has a charge that is opposite the charge on the first and second superconducting pads 201-1 and 201-2. The A and B modes have different frequencies, e.g., a mode frequency $f_B$ of the B mode 204 is greater than a mode frequency $f_A$ of the A mode 202, which allows individual excitation of one mode over the other mode.

To implement scalable quantum computing systems (e.g., a quantum processor) using superconducting qubits, it is important to minimize or eliminate cross-talk and unwanted ZZ interactions between coupled or neighboring qubits to, e.g., enable independent qubit control for high-fidelity single-qubit gate operations, and implement high-fidelity entanglement gates (e.g., two-qubit gates) between superconducting qubits. As noted above, an entanglement gate is an operation in which external fields (e.g., microwave signals) are applied to a quantum processor to create an entangled state between two or more separate qubits. For example, a controlled-phase gate (referred to herein as CPHASE gate) between two qubits is a type of entangling gate in which one qubit (e.g., target qubit) acquires a phase-shift if and only if both qubits are in their first excited state.

ZZ interaction is a type of longitudinal interaction between two qubits or modes, in which the excitation of one qubit or mode causes a shift in the transition frequency of the other qubit or mode. In certain instances, ZZ interaction provides a way to entangle two different qubits and create, e.g., a CPHASE gate, because a state-dependent shift in qubit frequency can be made equivalent to a state-dependent phase-shift. ZZ interactions are sometimes referred to as longitudinal coupling or denoted as chi or 2-chi coupling. On the other hand, in some instances, undesired ZZ interaction between two superconducting qubits is a source of crosstalk which can reduce the fidelity of gate operations.

For example, static ZZ interaction is a type of ZZ interaction that is present between two qubits or modes in the absence of any external RF drives. This "always-on" interaction comprises unwanted crosstalk, which can be detrimental to a quantum system of qubits by inhibiting independent control of each qubit and by creating unwanted entanglement. In particular, static ZZ coupling can occur between neighboring qubits, wherein the state of one qubit affects the qubit frequency of an adjacent qubit, wherein the static ZZ coupling can lead to gate errors. In this regard, static ZZ interaction is a type of unwanted crosstalk between neighboring qubits, which can adversely impact the fidelity of single-qubit gate operations, which are calibrated under the assumption that the qubit frequency is fixed.

Another source of crosstalk between neighboring qubits includes exchange interactions that occur when a microwave pulse is applied to one qubit (such as for a single-qubit gate operation), which can potentially affect another neighboring qubit if there is an exchange interaction present between such neighboring qubits. For example, if exchange interaction exists between two qubits, applying microwave pulses to one qubit can conceivably excite the other qubit, which is a form of crosstalk that could be detrimental.

Furthermore, another type of crosstalk is referred to as the "spectator effect," which denotes a condition in which a state of an uninvolved qubit (e.g., the "spectator") affects the fidelity/performance of a gate operation between two other qubits. For example, a two-qubit gate operation can be implemented by driving a coupling element which connects two qubits. In such instances, the coupling element can have its own operating frequency (e.g., transition frequency), which is calibrated to implement a high-fidelity two-qubit gate operation. If there is static ZZ coupling between the coupling element and a spectator qubit, the state of the spectator qubit can affect the transition frequency of the coupling element in a way that reduces the fidelity of the calibrated two-qubit gate operation.

Exemplary embodiments of the disclosure will now be discussed with regard to techniques for implementing a scalable quantum computing architecture with superconducting qubits that are coupled using a multimode qubit coupler to implement high-fidelity entanglement gate operations. The exemplary qubit coupling techniques as described herein are configured to suppress unwanted crosstalk between coupled superconducting qubits (e.g., suppress static ZZ interactions between the coupled superconducting qubits, and suppress exchange interactions between the coupled superconducting qubits when performing a single-gate operation on one of the coupled qubits), as well as suppressing spectator affects between multimode qubit couplers and neighboring qubits (e.g., spectator qubits).

Figure 3:
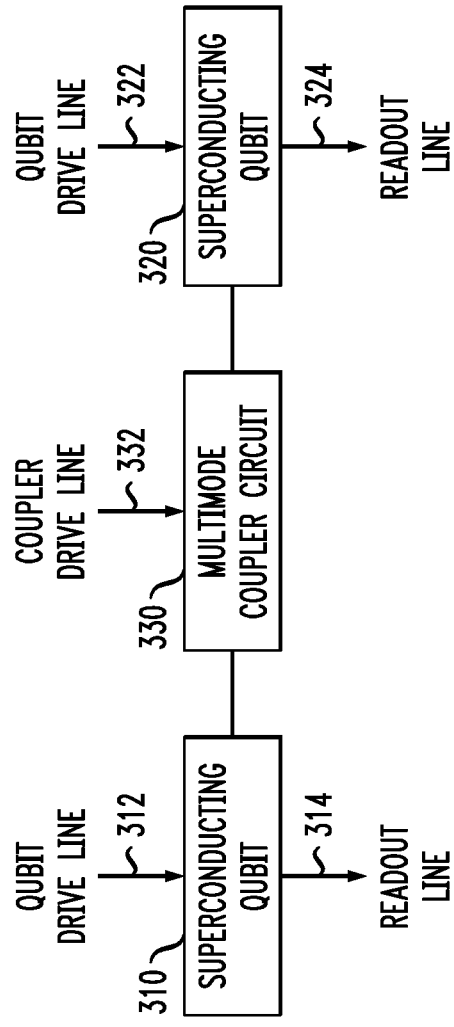
FIG. 3 schematically illustrates a quantum device comprising superconducting quantum bits that are coupled by a superconducting multimode coupler circuit, according to an exemplary embodiment of the disclosure.

FIG. 3 schematically illustrates a quantum device comprising superconducting quantum bits that are coupled by a multimode coupler circuit, according to an exemplary embodiment of the disclosure. In particular, FIG. 3 schematically illustrates a quantum device 300 comprising a first superconducting quantum bit 310 (or first qubit 310), a second superconducting quantum bit 320 (or second qubit 320), and a superconducting multimode coupler circuit 330 (or multimode coupler circuit 330). In the exemplary configuration, the first and second qubits 310 and 320 comprise computational qubits, and the multimode coupler circuit 330 is configured to mediate the interaction (e.g., ZZ interaction) between the first and second qubits 310 and 320 under different gate operations. In some embodiments, the first and second qubits 310 and 320 comprise different types of superconducting quantum bits. For example, in some embodiments, the first qubit 310 comprises a transmon qubit, and the second qubit 320 comprises a multimode two-junction superconducting qubit having a circuit architecture as shown in FIG. 3. In some embodiments, the first qubit 310 can be implemented using other types of superconducting qubits such as superconducting fluxonium qubits. In some embodiments, the first qubit 310 and the second qubit 320 comprise fixed-frequency qubits (not tunable), while other embodiments, the first and second qubits 310 and 320 can be tunable qubits, e.g., tunable transition frequencies.

Further, in some embodiments, the multimode coupler circuit 330 comprises a multimode two-junction superconducting qubit having a circuit architecture as shown in FIG. 3, which is capacitively coupled to the first and second qubits 310 and 320. The multimode coupler circuit 330 is configured to control exchange interactions between the first and second qubits 310 and 320 to implement entanglement gate operations, and to suppress crosstalk between the first and second qubits 310 and 320 during idle times (e.g., suppress static ZZ interaction) or when a single-qubit gate operation is being performed on one or both of the first and second qubits 310 and 320 (e.g., suppress ZZ interaction). In other embodiments, the multimode coupler circuit 330 can be implemented using any suitable superconducting multimode qubit framework which comprises a combination of two strongly interacting, anharmonic oscillators, wherein a composite quantum system is characterized by multiple modes of excitations which exhibit strong longitudinal couplings amongst themselves, i.e., the excitation of one mode can strongly shift the transition frequency of another mode.

The quantum device 300 further comprises a plurality of control lines (e.g., transmission line resonators) including, but not limited to, qubit drive lines 312 and 322, qubit readout lines 314 and 324, and a coupler drive line 332. In some embodiments, the qubit drive lines 312 and 322 are coupled (e.g., capacitively coupled) to the first and second qubits 310 and 320, respectively. In some embodiments, the qubit drive lines 312 and 322 are configured to apply control signals (e.g., microwave control pulse signals) to independently change the states of the respective first and second qubits 310 and 320 (e.g., single-qubit gate operations). As is known in the art, the state of a qubit can be changed by applying a microwave control signal (e.g., control pulse) with a center frequency equal to a transition frequency (denoted $f_{01}$) of the qubit, wherein the transition frequency $f_{01}$ corresponds to an energy difference between the ground state |0⟩ and excited state |1⟩ of the qubit. In addition, the axis of rotation about a given axis of the Bloch sphere 100 (e.g., X-axis, Y-axis, or any axis in the X-Y plane) and the amount (angle) of such rotation are based, respectively, on the phase of the microwave control signal, and the amplitude and duration of the microwave control signal.

Further, in some embodiments, the readout lines 314 and 324 are coupled to the first and second qubits 310 and 320, respectively, using known techniques (e.g., dispersive readout). In some embodiments, the readout lines 314 and 324 comprise transmission line readout resonators (e.g., coplanar transmission lines) which are configured to have resonant frequencies that are detuned from the respective transition frequencies of the respective first and second qubits 310 and 320. Due to the coupling of the readout lines 314 and 324 to the respective first and second qubits 310 and 320, there is a shift in the resonant frequencies of transmission line readout resonators depending on the states of the respective first and second qubits 310 and 320. The change in resonant frequency of the transmission line readout resonator, which is coupled to a given qubit, is utilized to determine a readout state of the given qubit, e.g., ground state |0⟩ or excited state |1⟩, wherein for readout, superposition states of the given qubit are projected onto one of the ground state or excited state of the qubit, as is known in the art.

The coupler drive line 332 is coupled (e.g., capacitively coupled) to the multimode coupler circuit 330. In some embodiments, the multimode coupler circuit 330 comprises two distinct normal modes of excitation (e.g., distinct A and B modes of excitations with distinct frequencies and spatial symmetries, as shown in FIG. 2C), wherein the coupler drive line 332 is configured to apply a control signal to the multimode coupler circuit 330 to control mode-selective exchange coupling between the first and second qubits 310 and 320 and the different excitation modes of the multimode coupler circuit 330.

For example, as explained in further detail below, multimode coupler circuit 330 comprises a first mode and a second mode, and is configured to operate in a first state or in a second state in response to a drive control signal applied to the multimode coupler circuit 330. In the first state of the multimode coupler circuit 330 (e.g., ground state |0⟩, with no control pulse applied on the coupler drive line 332), the first qubit 310 is exchange coupled to the first mode (e.g., A mode) of the multimode coupler circuit 330, and the second qubit 320 is exchange coupled to the second mode (e.g., B mode) the multimode coupler circuit 330, which suppresses interaction between the first and second qubits 310 and 320.

On the other hand, in the second state of the multimode coupler circuit 330, a suitably calibrated control pulse is applied to the coupler drive line 332 to drive the second mode (e.g., B mode) of the multimode coupler circuit 330 through a full $2\pi$ rotation (e.g., from ground state |0⟩ to the first excited state |1⟩, and back to the ground state |0⟩), which causes the first and second qubits 310 and 320 to be exchanged coupled to both the first and second modes of the multimode coupler circuit 330, to enable interaction between the first and second qubits 310 and 320 and perform an entanglement gate operation.

It is to be noted that in embodiments where the first qubit 310 and/or the second qubit 320 comprises a frequency-tunable qubit (e.g., a flux-tunable transmon qubit or fluxonium qubit, etc.), the quantum device 300 would comprise flux bias control lines coupled (e.g., inductively coupled) to respective tunable qubits. In such embodiments, the flux bias control lines would be configured to apply flux bias control signals to tuning structures of the qubits to tune the operating frequencies of the tunable qubits, as needed for a given application. For example, a flux-tunable transmon qubit can be implemented by replacing a transmon Josephson junction by a superconducting quantum interference device (SQUID) which forms superconducting loop (referred to as SQUID loop) through an external magnetic flux can be threaded to change the effective Josephson energy of the transmon qubit and, thus, change the transition frequency of the transmon qubit. In this regard, the flux bias control lines would be configured to apply an external magnetic flux to the SQUID loops of the transmon qubits to tune the transition frequencies of the transmon qubits.

Figure 4:
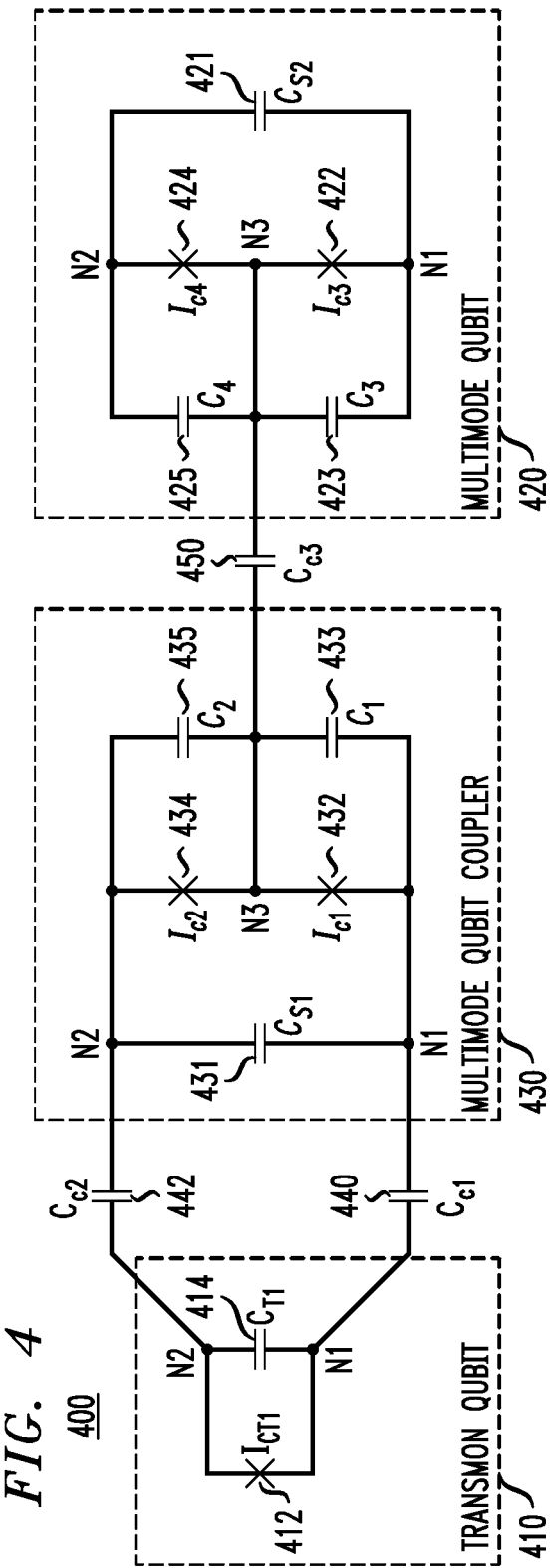
FIG. 4 schematically illustrates a circuit diagram of a quantum device comprising superconducting quantum bits that are coupled by a superconducting multimode coupler circuit, according to an exemplary embodiment of the disclosure.

The quantum device 300 of FIG. 3 can be implemented using different circuit architectures according to exemplary embodiments which will now be described in further detail in conjunction with FIGS. 4, 5, and 6. For example, FIG. 4 schematically illustrates a circuit diagram of a quantum device comprising superconducting quantum bits that are coupled by a superconducting multimode coupler circuit, according to an exemplary embodiment of the disclosure. More specifically, FIG. 4 is a schematic circuit diagram (e.g., lumped-element circuit representation) of a superconducting quantum circuit 400 comprising a superconducting transmon qubit (or first data qubit 410), a superconducting multimode qubit 420 (or second data qubit 420), a superconducting multimode qubit coupler 430, a first coupling capacitor 440, a second coupling capacitor 442, and a third coupling capacitor 450. The superconducting multimode qubit coupler 430 and the coupling capacitors 440 and 442 collectively comprise an exemplary embodiment of the multimode coupler circuit 330 of FIG. 3.

The superconducting transmon qubit 410 comprises a superconducting Josephson tunnel junction 412 (with a critical current $I_{CT1}$) and a shunt capacitor 414 (with a capacitance $C_{T1}$), which are connected in parallel between a first node N1 and a second node N2 of the superconducting transmon qubit 410. The Josephson tunnel junction 412 comprises a small junction capacitance which is omitted from FIG. 4 for ease of illustration. The capacitance $C_{T1}$ of the shunt capacitor 414 is large relative to the junction capacitance of the Josephson tunnel junction 412.

In some embodiments, as shown in FIG. 4, the superconducting multimode qubit 420 and the superconducting multimode qubit coupler 430 each comprise a multimode two-junction superconducting qubit architecture, which is similar to the multimode two-junction superconducting qubit 200 of FIG. 2A. In particular, the superconducting multimode qubit coupler 430 comprises a shunt capacitor 431, and two capacitively-shunted superconducting tunnel junctions (e.g., Josephson junctions) connected in series between a first node N1 and a second N2 of the superconducting multimode qubit coupler 430, wherein a first capacitively-shunted Josephson junction comprises a Josephson junction 432 and a capacitor 433, and wherein a second capacitively-shunted Josephson junction comprises a Josephson junction 434 and a capacitor 435. The shunt capacitor 431 has a capacitance $C_{S1}$, the Josephson junction 432 has a critical current $I_{C1}$, the Josephson junction 434 has a critical current $I_{C2}$, the capacitor 433 has a capacitance $C_1$, and the capacitor 435 has a capacitance $C_2$. The two capacitively-shunted superconducting Josephson junctions are coupled to a middle node N3 of the superconducting multimode qubit coupler 430.

Similarly, the superconducting multimode qubit 420 comprises a shunt capacitor 421, and two capacitively-shunted superconducting tunnel junctions (e.g., Josephson junctions) connected in series between a first node N1 and a second N2 of the superconducting multimode qubit 420, wherein a first capacitively-shunted Josephson junction comprises a Josephson junction 422 and a capacitor 423, and wherein a second capacitively-shunted Josephson junction comprises a Josephson junction 424 and a capacitor 425. The shunt capacitor 421 has a capacitance $C_{S2}$, the Josephson junction 422 has critical current $I_{C3}$, the Josephson junction 424 has a critical current $I_{C4}$, the capacitor 423 has a capacitance $C_3$, and the capacitor 425 has a capacitance $C_4$. The two capacitively-shunted superconducting Josephson junctions are coupled to a middle node N3 of the superconducting multimode qubit 420.

As further shown in FIG. 4, the first coupling capacitor 440 is configured to capacitively couple the first node N1 of the superconducting transmon qubit 410 to the first node N1 of the superconducting multimode qubit coupler 430. Further, the second coupling capacitor 442 is configured to capacitively couple the second node N2 of the superconducting transmon qubit 410 to the second node N2 of the superconducting multimode qubit coupler 430. In addition, the third coupling capacitor 450 is configured to capacitively couple the third node N3 of the superconducting multimode qubit 420 to the third node N3 the superconducting multimode qubit coupler 430.

In the exemplary circuit configuration of FIG. 4, the superconducting transmon qubit 410, and the superconducting multimode qubit 420 are configured as "data qubits" to store quantum data, while the superconducting multimode qubit coupler 430 comprises a multimode qubit that is configured as a "coupler qubit" to couple the data qubits and control interaction between the data qubits. As noted above, by virtue of having a multimode two-junction superconducting qubit architecture, the superconducting multimode qubit 420 and the superconducting multimode qubit coupler 430 each comprise two distinct modes of excitation, e.g., an A mode and a B mode, such as shown in FIG. 2C. The superconducting transmon qubit 410 and the superconducting multimode qubit 420 are directly coupled to different modes of the superconducting multimode qubit coupler 430.

For example, in some embodiments, the superconducting transmon qubit 410 is directly coupled to the A mode of the superconducting multimode qubit coupler 430 by virtue of the capacitive coupling of the respective first nodes N1 through the first coupling capacitor 440, and the capacitive coupling of the respective second nodes N2 through the second coupling capacitor 442. In addition, the superconducting multimode qubit 420 is directly coupled to the B mode of the superconducting multimode qubit coupler 430 by virtue of the capacitive coupling of the respective third nodes N3 through the coupling capacitor 450. More specifically, in the exemplary embodiment shown in FIG. 4, the B mode of the superconducting multimode qubit 420 is directly coupled to the B mode of the superconducting multimode qubit coupler 430 by virtue of the capacitive coupling of the respective third nodes N3 through the third coupling capacitor 450. Furthermore, the A mode of the superconducting multimode qubit 420 is configured as a data mode which is utilized to store quantum data whereby, in the exemplary configuration of FIG. 4, the A mode is not directly coupled to the superconducting multimode qubit coupler 430.

Furthermore, in the exemplary configuration of FIG. 4, the superconducting multimode qubit coupler 430 is configured to operate in a first state (referred to herein as "off" state) and a second state (referred to herein as "on" state), to control the interaction between the coupled data qubits, e.g., the superconducting transmon qubit 410 and the superconducting multimode qubit 420. In some embodiments, the operating state of the superconducting multimode qubit coupler 430 is controlled by applying a microwave control pulse to the superconducting multimode qubit coupler 430 (via the coupler drive line 332, FIG. 3, not specifically shown in FIG. 4) to control the state of the B mode of the superconducting multimode qubit coupler 430.

For example, in the "off" state, the B mode of the superconducting multimode qubit coupler 430 is in a ground state $|0\rangle$, and no microwave control pulse is applied to the superconducting multimode qubit coupler 430. In the "off" state, the superconducting multimode qubit coupler 430 enforces a mode-selective exchange coupling between the first and second data qubits 410 and 420, and the different excitation modes of the superconducting multimode qubit coupler 430 to create a condition of essentially zero interaction (e.g., suppressed static ZZ interaction) between the first and second data qubits 410 and 420. More specifically, when the superconducting multimode qubit coupler 430 is in the "off" state, the superconducting transmon qubit 410 is exchanged coupled to only the A mode of the superconducting multimode qubit coupler 430, and the B mode of the superconducting multimode qubit 420 is exchange coupled to only the B mode of the superconducting multimode qubit coupler 430, due to the different charge patterns of the A and B modes of the superconducting multimode qubit coupler 430 (e.g., as shown in FIG. 3C). In this regard, in the "off" state, the residual longitudinal interaction (e.g., static ZZ interaction) between the first and second data qubits 410 and 420 is substantially suppressed because the first and second data qubits 410 and 420 are exchange coupled to the different modes of the superconducting multimode qubit coupler 430.

On the other hand, to perform an entanglement gate operation, the superconducting multimode qubit coupler 430 is temporarily driven to an "on" state by applying a microwave control pulse (with a properly calibrated frequency, duration, and envelope amplitude, etc.) to drive the B mode of the superconducting multimode qubit coupler 430 through a full $2\pi$ rotation around the X-axis of the Bloch sphere, e.g., from ground state $|0\rangle$ to the first excited state $|1\rangle$, and back to the ground state $|0\rangle$. The microwave control pulse drives the B mode of the superconducting multimode qubit coupler 430 in manner which changes the energy of the A and B modes of the superconducting multimode qubit coupler 430 and essentially breaks the mode-selective coupling of the first and second data qubits 410 and 420 to the respective A and B modes of the superconducting multimode qubit coupler 430, thereby allowing ZZ interaction between the first and second data qubits 410 and 420 to perform an entangling gate operation (e.g., CPHASE gate operation).

More specifically, driving the B mode of the superconducting multimode qubit coupler 430 causes a state-dependent Stark shifting of the data modes of both the first and second data qubits 410 and 420 (e.g., a plasmon mode of the superconducting transmon qubit 410, and the A mode of the superconducting multimode qubit 420), which causes the data modes of the first and second data qubits 410 and 420 to have longitudinal coupling (e.g., ZZ coupling) to the B mode of the superconducting multimode qubit coupler 430. The state-dependent Stark shifting of the data modes is equivalent to a microwave-activated ZZ coupling between the data modes of the first and second data qubits 410 and 420 which mediates an entangling gate operation between the first and second data qubits 410 and 420. For example, for a CPHASE gate operation, a conditional Z rotation can be achieved when the data modes of the first and second data qubits 410 and 420 are both in an excited state (e.g., ket $|1\rangle$ state).

It is to be noted that a state-dependent Stark shifting is a type of AC Stark shifting which is utilized in the coupling configuration of FIG. 4 to mediate longitudinal interaction (e.g., ZZ interaction) between the first and second data qubits 410 and 420 to implement an entanglement gate operation. In general, an AC Stark shifting is based on the AC Stark effect in which the transition frequency of a qubit can be shifted by some amount by applying an electromagnetic (EM) tone to the qubit. The amount of AC Stark shifting of the transition frequency of the qubit is based on, e.g., a strength (e.g., amplitude) of the EM tone, and an amount of detuning between the frequency of the EM tone and the transition frequency of the qubit. In the exemplary embodiment of FIG. 4, a state-dependent Stark shifting is realized by applying a microwave pulse with a given frequency to drive the B mode of the superconducting multimode qubit coupler 430 (which has a given transition frequency), which causes the exchange coupling of energy between the superconducting multimode qubit coupler 430 and the first and second data qubits 410 and 420. Depending on the states of the first and second data qubits 410 and 420, a shift in the transition frequency of the superconducting multimode qubit coupler 430 can occur depending on the data qubit states, wherein such state-based shift in the transition frequency of the superconducting multimode qubit coupler 430, in turn, modifies the strength of the AC Stark shifting felt by the first and second data qubits 410 and 420. The resulting state-dependent Stark shifting is utilized to realize a controlled-Z gate between the first and second data qubits 410 and 420.

The exemplary superconducting quantum circuit 400 shown in FIG. 4 can be implemented using planar microwave circuit elements that are formed on a substrate (e.g., silicon substrate) using state-of-the-art semiconductor fabrication techniques and materials. For example, the various components of the superconducting qubits (e.g., Josephson tunnel junction devices, inductors, capacitors), interconnects, coupling circuitry, coupler drive lines, qubit drive lines, and the state readout lines, etc., comprise lithographically defined patterns of superconducting materials formed on a semiconductor substrate. The circuit elements can be formed using various types of superconductor materials that are suitable for a given application, including, but not limited to, elementary metals such as niobium (Nb), aluminum (Al), tantalum (Ta), and compounds such as titanium nitride (TiN), niobium nitride (NbN), niobium titanium nitride (NbTiN), etc. A Josephson tunnel junction device comprises two superconducting electrodes that are separated by a thin insulating barrier. For example, a Josephson tunnel junction device for a superconducting qubit may comprise an Al—$AlO_x$—Al trilayer tunnel junction that is fabricated using a double-angle evaporation technique, or other suitable fabrication techniques.

Figure 5:
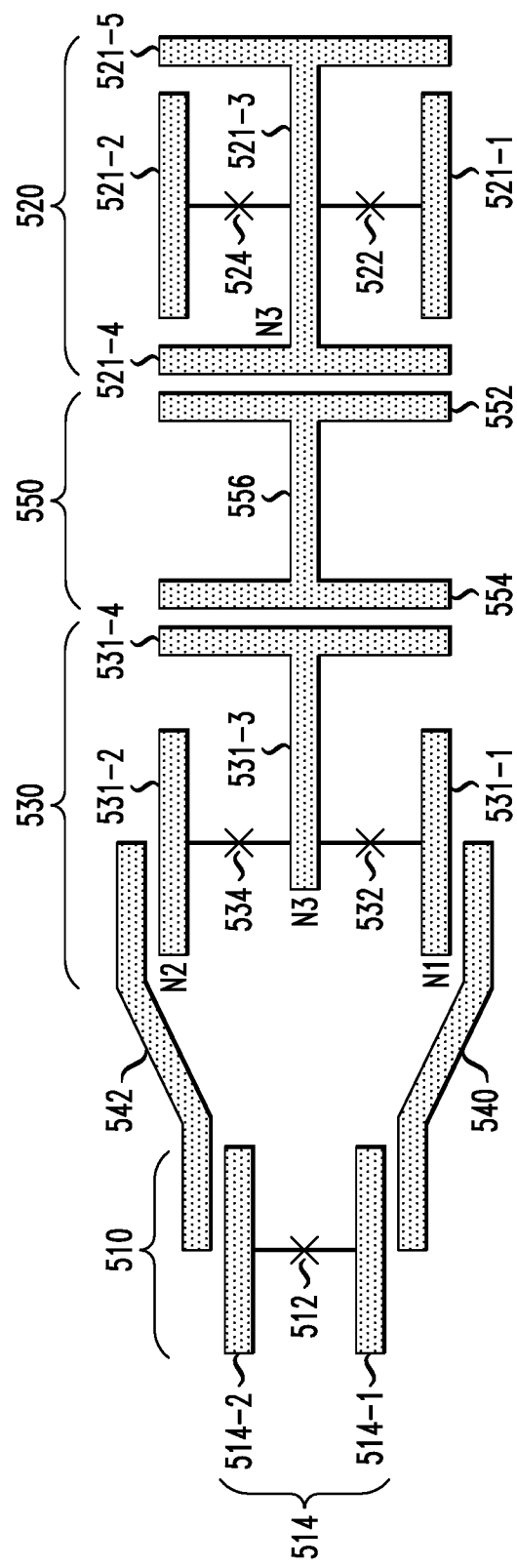
FIG. 5 schematically illustrates a planar circuit configuration of the superconducting quantum circuit of FIG. 4, according to an exemplary embodiment of the disclosure.

FIG. 5 schematically illustrates a planar circuit configuration of the superconducting quantum circuit 400 of FIG. 4, according to an exemplary embodiment of the disclosure. More specifically, FIG. 5 schematically illustrates a planar superconducting quantum circuit 500 comprising a superconducting transmon qubit 510 (or first data qubit 510), a superconducting multimode qubit 520 (or second data qubit 520), a superconducting multimode qubit coupler 530, a first superconducting coupling capacitor 540, a second superconducting coupling capacitor 542, and a third superconducting coupling capacitor 550.

The superconducting transmon qubit 510 comprises a Josephson tunnel junction device 512, and a shunt capacitor 514. In some embodiments, the shunt capacitor 514 comprises a coplanar parallel-plate capacitor structure comprising a first superconducting pad 514-1 (or first electrode), and a second superconducting pad 514-2 (or second electrode), which corresponds to the shunt capacitor 414 (in FIG. 4) having a shunt capacitance $C_{T1}$. The Josephson tunnel junction device 512 comprises first and second superconducting electrodes that are coupled to the first and second superconducting pads 514-1 and 514-2, respectively, of the shunt capacitor 514. In some embodiments, as schematically illustrated in FIG. 5, the Josephson tunnel junction device 512 is disposed between the first and second superconducting pads 514-1 and 514-2 of the shunt capacitor 514.

The superconducting multimode qubit 520 comprises a first superconducting pad 521-1, a second superconducting pad 521-2, a third superconducting pad 521-3, a fourth superconducting pad 521-4, a fifth superconducting pad 521-5, a first Josephson tunnel junction device 522, and a second Josephson tunnel junction device 524. The first and second superconducting pads 521-1 and 521-2 comprise electrodes of a coplanar parallel-plate capacitor structure which correspond to the shunt capacitor 421 (FIG. 4) with the capacitance $C_{S2}$. The first Josephson tunnel junction device 522 is coupled to, and disposed between, the first and third superconducting pads 521-1 and 521-3. The second Josephson tunnel junction device 524 is coupled to, and disposed between, the second and third superconducting pads 521-2 and 521-3.

The first and third superconducting pads 521-1 and 521-3 comprise electrodes of a coplanar parallel-plate capacitor structure which corresponds to the shunt capacitor 423 (FIG. 4) which provides the capacitance $C_3$ across the Josephson tunnel junction device 522. Similarly, the second and third superconducting pads 521-2 and 521-3 comprise electrodes of a coplanar parallel-plate capacitor structure which corresponds to the shunt capacitor 425 (FIG. 4) which provides the shunt capacitance $C_4$ across the Josephson tunnel junction device 524. Further, in some embodiments, as shown in FIG. 5, the fourth and fifth superconducting pads 521-4 and 521-5 are connected to opposite ends of the third superconducting pad 521-3 which corresponds to the third node N3 of the superconducting multimode qubit 520. The fourth and fifth superconducting pads 521-4 and 521-5 are configured to mediate capacitive coupling to the B mode of the superconducting multimode qubit 520, as discussed above.

The superconducting multimode qubit coupler 530 comprises a first superconducting pad 531-1, a second superconducting pad 531-2, a third superconducting pad 531-3, a fourth superconducting pad 531-4, a first Josephson tunnel junction device 532, and a second Josephson tunnel junction device 534. The first and second superconducting pads 531-1 and 531-2 comprise electrodes of a coplanar parallel-plate capacitor structure which corresponds to the shunt capacitor 431 (FIG. 4) with the capacitance $C_{S1}$. The first Josephson tunnel junction device 532 is coupled to, and disposed between, the first and third superconducting pads 531-1 and 531-3. The second Josephson tunnel junction device 534 is coupled to, and disposed between, the second and third superconducting pads 531-2 and 531-3.

The first and third superconducting pads 531-1 and 531-3 comprise electrodes of a coplanar parallel-plate capacitor structure which corresponds to the shunt capacitor 433 (FIG. 4) which provides the shunt capacitance $C_1$ across the Josephson tunnel junction device 532. Similarly, the second and third superconducting pads 531-2 and 531-3 comprise electrodes of a coplanar parallel-plate capacitor structure which corresponds to the shunt capacitor 435 (FIG. 4) which provides the shunt capacitance $C_2$ across the Josephson tunnel junction device 534. Further, in some embodiments, as shown in FIG. 5, the fourth superconducting pad 531-4 is connected to an end of the third superconducting pad 531-3 which corresponds to the third node N3 of the superconducting multimode qubit coupler 530. The fourth superconducting pad 521-4 is configured to enable and mediate capacitive coupling to the B mode of the superconducting multimode qubit coupler 530, as discussed above.

The first and second superconducting coupling capacitors 540 and 542 are configured to enable and mediate the capacitive coupling of the first data qubit 510 to the A mode of the superconducting multimode qubit coupler 530, and the third superconducting coupling capacitor 550 is configured to enable and mediate the capacitive coupling of the B mode of the second data qubit 520 to the B mode of the superconducting multimode qubit coupler 530. More specifically, as shown in the exemplary embodiment of FIG. 5, the first superconducting coupling capacitor 540 (which corresponds to the first coupling capacitor 440 of FIG. 4) comprises a superconducting planar transmission line, such as a coplanar waveguide, which is configured to capacitively couple the first superconducting pad 514-1 of the shunt capacitor 514 of the superconducting transmon qubit 510 to the first superconducting pad 531-1 (e.g., node N1) of the superconducting multimode qubit coupler 530. The first superconducting coupling capacitor 540 comprises (i) a first end portion which overlaps a portion of the first superconducting pad 514-1 of the shunt capacitor 514 of the superconducting transmon qubit 510, and (ii) a second end portion which overlaps a portion of the first superconducting pad 531-1 of the superconducting multimode qubit coupler 530. The amount of coupling capacitance (e.g., $C_{C1}$) provided by first superconducting coupling capacitor 540 depends at least in part on the amount of overlap and spacing between the end portions of the first superconducting coupling capacitor 540 and the first superconducting pads 514-1 and 531-1.

Similarly, the second superconducting coupling capacitor 542 (which corresponds to the second coupling capacitor 442 of FIG. 4) comprises a superconducting planar transmission line, such as a coplanar waveguide, which is configured to capacitively couple the second superconducting pad 514-2 of the shunt capacitor 514 of the superconducting transmon qubit 510 to the second superconducting pad 531-2 (e.g., node N2) of the superconducting multimode qubit coupler 530. The second superconducting coupling capacitor 542 comprises (i) a first end portion which overlaps a portion of the second superconducting pad 514-2 of the shunt capacitor 514 of the superconducting transmon qubit 510, and (ii) a second end portion which overlaps a portion of the second superconducting pad 531-2 of the superconducting multimode qubit coupler 530. The amount of coupling capacitance (e.g., $C_{C2}$) provided by second superconducting coupling capacitor 542 depends at least in part on the amount of overlap and spacing between the end portions of the second superconducting coupling capacitor 542 and the second superconducting pads 514-2 and 531-2.

Further, the third superconducting coupling capacitor 550 (which corresponds to the third coupling capacitor 450 of FIG. 4) comprises a first superconducting pad 552 (or first coupling electrode), a second superconducting pad 554 (or second coupling electrode), which are connected by a superconducting planar transmission line 556 (e.g., coplanar waveguide). The first superconducting pad 552 is capacitively coupled to the fourth superconducting pad 521-4 of the superconducting multimode qubit 520. The second superconducting pad 554 is capacitively coupled to the fourth superconducting pad 531-4 of the superconducting multimode qubit coupler 530. In this exemplary configuration, the third node N3 of the superconducting multimode qubit 520 is capacitively coupled to the third node N3 of the superconducting multimode qubit coupler 530 (e.g., direct coupling of the B modes of second data qubit 520 and the superconducting multimode qubit coupler 530. The amount of coupling capacitance (e.g., $C_{C3}$) provided by third superconducting coupling capacitor 550 depends at least in part on (i) the amount of capacitive coupling between the superconducting pads 552 and 524-1, and (ii) the amount of capacitive coupling between the superconducting pads 554 and 531-4.

Figure 6:
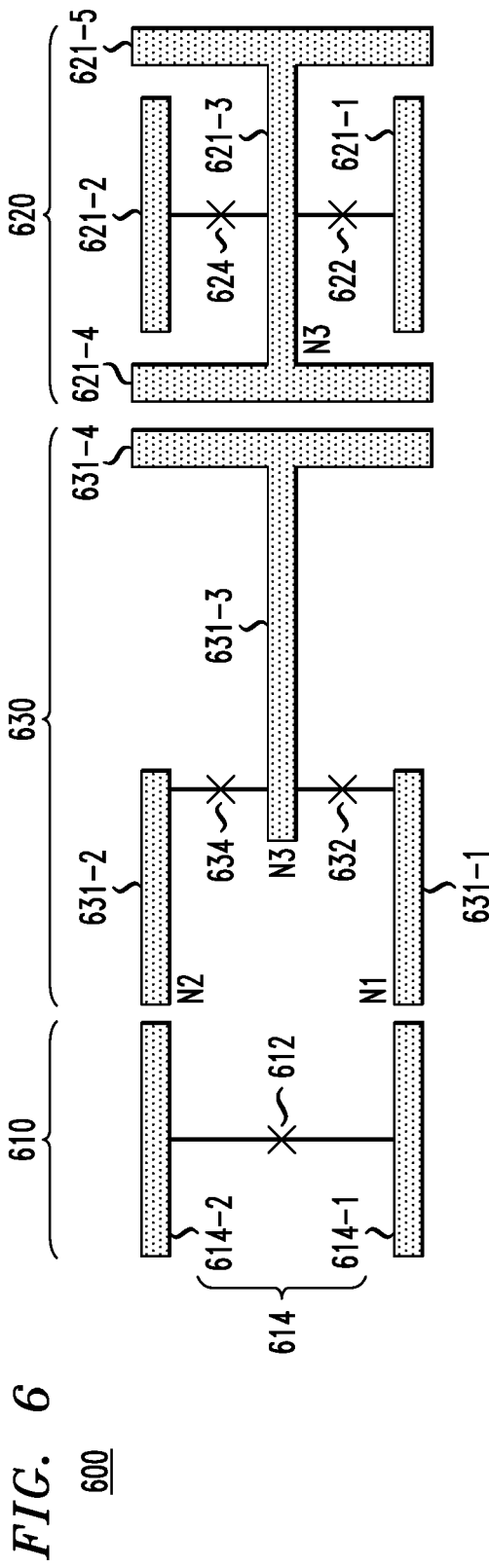
FIG. 6 schematically illustrates a planar circuit configuration of the superconducting quantum circuit of FIG. 4, according to another exemplary embodiment of the disclosure.

FIG. 6 schematically illustrates a planar circuit configuration of the superconducting quantum circuit 400 of FIG. 4, according to another exemplary embodiment of the disclosure. More specifically, FIG. 6 schematically illustrates a planar superconducting quantum circuit 600 comprising a superconducting transmon qubit 610 (or first data qubit 610), a superconducting multimode qubit 620 (or second data qubit 620), and a superconducting multimode qubit coupler 630. In contrast to the exemplary embodiment of FIG. 5, the planar superconducting quantum circuit 600 of FIG. 6 is configured to provide direct capacitive coupling of the first and second data qubits 610 and 620 to the superconducting multimode qubit coupler 630 without the need for separate superconducting coupling capacitors.

The superconducting transmon qubit 610 comprises a Josephson tunnel junction device 612, and a shunt capacitor 614. In some embodiments, the shunt capacitor 614 comprises a coplanar parallel-plate capacitor structure comprising a first superconducting pad 614-1 (or first electrode), and a second superconducting pad 614-2 (or second electrode), which corresponds to the shunt capacitor 414 (in FIG. 4)

having a shunt capacitance $C_{T1}$. The Josephson tunnel junction device 612 comprises first and second superconducting electrodes that are coupled to the first and second superconducting pads 614-1 and 614-2, respectively, of the shunt capacitor 614. In some embodiments, as schematically illustrated in FIG. 6, the Josephson tunnel junction device 612 is disposed between the first and second superconducting pads 614-1 and 614-2 of the shunt capacitor 614.

The superconducting multimode qubit 620 comprises a first superconducting pad 621-1, a second superconducting pad 621-2, a third superconducting pad 621-3, a fourth superconducting pad 621-4, a fifth superconducting pad 621-5, a first Josephson tunnel junction device 622, and a second Josephson tunnel junction device 624. The first and second superconducting pads 621-1 and 621-2 comprise electrodes of a coplanar parallel-plate capacitor structure which corresponds to the shunt capacitor 421 (FIG. 4) with a capacitance $C_{S2}$. The first Josephson tunnel junction device 622 is coupled to, and disposed between, the first and third superconducting pads 621-1 and 621-3. The second Josephson tunnel junction device 624 is coupled to, and disposed between, the second and third superconducting pads 621-2 and 621-3.

The first and third superconducting pads 621-1 and 621-3 comprise electrodes of a coplanar parallel-plate capacitor structure which corresponds to the shunt capacitor 423 (FIG. 4) which provides the shunt capacitance $C_3$ across the Josephson tunnel junction device 622. Similarly, the second and third superconducting pads 621-2 and 621-3 comprise electrodes of a coplanar parallel-plate capacitor structure which corresponds to the shunt capacitor 425 (FIG. 4) which provides the shunt capacitance $C_4$ across the Josephson tunnel junction device 624. Further, in some embodiments, as shown in FIG. 6, the fourth and fifth superconducting pads 621-4 and 621-5 are connected to opposite ends of the third superconducting pad 621-3 which corresponds to the third node N3 of the superconducting multimode qubit 620. The fourth and fifth superconducting pads 621-4 and 621-5 are configured to mediate capacitive coupling to the B mode of the superconducting multimode qubit 620, as discussed above.

The superconducting multimode qubit coupler 630 comprises a first superconducting pad 631-1, a second superconducting pad 631-2, a third superconducting pad 631-3, a fourth superconducting pad 631-4, a first Josephson tunnel junction device 632, and a second Josephson tunnel junction device 634. The first and second superconducting pads 631-1 and 631-2 comprise electrodes of a coplanar parallel-plate capacitor structure which corresponds to the shunt capacitor 431 (FIG. 4) with a capacitance $C_{S1}$. The first Josephson tunnel junction device 632 is coupled to, and disposed between, the first and third superconducting pads 631-1 and 631-3. The second Josephson tunnel junction device 634 is coupled to, and disposed between, the second and third superconducting pads 631-2 and 631-3.

The first and third superconducting pads 631-1 and 631-3 comprise electrodes of a coplanar parallel-plate capacitor structure which corresponds to the shunt capacitor 433 (FIG. 4) which provides the shunt capacitance $C_1$ across the Josephson tunnel junction device 632. Similarly, the second and third superconducting pads 631-2 and 631-3 comprise electrodes of a coplanar parallel-plate capacitor structure which corresponds to the shunt capacitor 435 (FIG. 4) which provides the shunt capacitance $C_2$ across the Josephson tunnel junction device 634.

Further, in some embodiments, as shown in FIG. 6, the fourth superconducting pad 631-4 is connected to an end of the third superconducting pad 631-3 which corresponds to the third node N3 of the superconducting multimode qubit coupler 430. The fourth superconducting pads 621-4 and 631-4 are configured to enable and mediate direct capacitive coupling of the B mode of the superconducting multimode qubit 620 to the B mode of the superconducting multimode qubit coupler 630. Moreover, as further shown in FIG. 6, the superconducting transmon qubit 610 is capacitively coupled directly to the A mode of the superconducting multimode qubit coupler 630 as a result of (i) the direct capacitive coupling of the respective first superconducting pads 614-1 and 631-1 and (ii) the direct capacitive coupling of the respective second superconducting pads 614-2 and 631-2, of the superconducting transmon qubit 610 and the superconducting multimode qubit coupler 630.

The various superconducting circuit elements of the superconducting quantum circuits 400, 500, and 600 in FIGS. 4, 5, and 6 can be configured to achieve desired operating characteristics. In some embodiments, a superconducting multimode qubit coupler which couples first and second data qubits would be configured with A and B modes having frequencies close to the transition frequencies of the first and second data qubits. In addition, the transition frequencies of the first and second data qubits would be slightly different. To implement an entanglement gate, the superconducting multimode qubit coupler would be driven with a microwave control signal having a frequency close to the transition frequencies of the first and second data qubits.

For example, with reference to FIG. 4, in a non-limiting exemplary embodiment, the superconducting transmon qubit 410 comprises a fixed-frequency transmon qubit which can be configured to have a transition frequency $f_Q$=4.29 GHz and a given anharmonicity, where such operating parameters are achieved based on, e.g., the selection of specific values of the critical current $I_{CT1}$ of the Josephson tunnel junction device 412 and the capacitance $C_{T1}$ of the shunt capacitor 414. Furthermore, in a non-limiting exemplary embodiment, the superconducting multimode qubit 420 can be configured to have A mode frequency ($f_A$) and a B mode frequency ($f_B$) of $f_A$=4.2 GHz and $f_B$=5.54 GHz and respective anharmonicities, where such operating parameters are achieved based on, e.g., the selection of specific values of the critical currents Ica and $I_{C4}$ of the Josephson tunnel junction devices 422 and 424, and the capacitances $C_{S2}$, $C_3$, and $C_4$ of the respective capacitors 421, 423, and 425.

Moreover, in a non-limiting exemplary embodiment, the superconducting multimode qubit coupler 430 can be configured to have A mode frequency ($f_A$) and a B mode frequency ($f_B$) of $f_A$=4.1 GHz, and $f_B$=5.82 GHz, and respective anharmonicities, where such operating parameters are achieved based on, e.g., the selection of specific values of the critical currents $I_{C1}$ and $I_{C2}$ of the Josephson tunnel junction devices 432 and 434, and the capacitances $C_{S1}$, $C_1$, and $C_2$ of the respective capacitors 431, 433, and 435. Furthermore, the coupling capacitances are selected to achieve a desired level of exchange coupling between the first data qubit 410 and the superconducting multimode qubit coupler 430, and between the second data qubit 420 and the superconducting multimode qubit coupler 430.

With these exemplary parameters, computer simulations were performed which indicated that a significantly low static ZZ coupling (e.g., as low as 1.6 kHz) can be achieved between the superconducting transmon qubit 410 and the A mode (data mode) of the superconducting multimode qubit 420 with the superconducting multimode qubit coupler 430 in the "off" state. Furthermore, the computer simulations indicated that (i) a relatively high longitudinal coupling (e.g., as high as 22.4 MHz) can be achieved between the superconducting transmon qubit 410 and the B mode of the superconducting multimode qubit coupler 430, and that (ii) a relatively high longitudinal coupling (e.g., as high as 29.6 MHz) can be achieved between the A mode (data mode) of the superconducting multimode qubit 420 and the B mode of the superconducting multimode qubit coupler 430, when the superconducting multimode qubit coupler 430 is driven into an "on" state via a calibrated microwave pulse. In this regard, the longitudinal coupling (e.g., ZZ coupling) between the B mode of the superconducting multimode qubit coupler 430 and the data modes of the first and second data qubits 410 and 420 is approximately 10,000 times as large as the static ZZ coupling between the data modes of the first and second data qubits 410 and 420.

Figure 7:
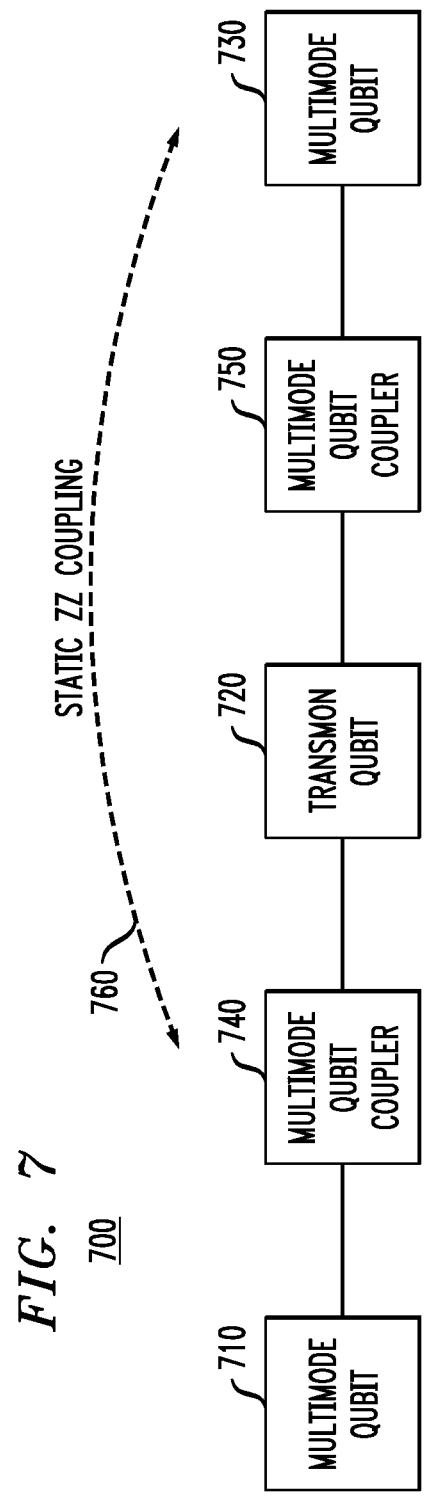
FIG. 7 schematically illustrates a quantum device comprising an array of superconducting quantum bits and multimode couplers, which is configured to suppress crosstalk with spectator quantum bits, according to an exemplary embodiment of the disclosure.

Furthermore, as noted above, the exemplary quantum circuits as discussed herein are configured to suppress the effects of spectator qubits. For example, FIG. 7 schematically illustrates a quantum device 700 comprising an array of superconducting quantum bits and multimode qubit couplers, which is configured to suppress crosstalk between a spectator quantum bit and a neighboring multimode qubit coupler, according to an exemplary embodiment of the disclosure. More specifically, the quantum device 700 comprises a first superconducting multimode qubit 710, a superconducting transmon qubit 720, a second superconducting multimode qubit 730, a first superconducting multimode qubit coupler 740, and a second superconducting multimode qubit coupler 750. The first superconducting multimode qubit 710 and the superconducting transmon qubit 720 are coupled together through the first superconducting multimode qubit coupler 740. In addition, the superconducting transmon qubit 720 and the second superconducting multimode qubit 730 are coupled together through the second superconducting multimode qubit coupler 750.

In the exemplary configuration of FIG. 7, the second superconducting multimode qubit 730 can act as a spectator qubit which potentially can adversely affect the transition frequency of the first superconducting multimode qubit coupler 740 through static ZZ coupling 760, and thus adversely affect the fidelity of an entanglement gate operation that is performed between the first superconducting multimode qubit 710 and the superconducting transmon qubit 720. Similarly, the first superconducting multimode qubit 710 can act as a spectator qubit which potentially can adversely affect the transition frequency of the second superconducting multimode qubit coupler 750 through static ZZ coupling, and thus adversely affect the fidelity of an entanglement gate operation that is performed between the second superconducting multimode qubit 730 and the superconducting transmon qubit 720. The exemplary quantum device 700, however, is configured to suppress crosstalk between a given superconducting multimode qubit and a neighboring multimode qubit coupler that is not directly coupled to the given superconducting multimode qubit.

For example, assume that the superconducting transmon qubit 720, the second superconducting multimode qubit coupler 750, and the second superconducting multimode qubit 730 have the same operating characteristics as the superconducting transmon qubit 410, the superconducting multimode qubit coupler 430, and second superconducting multimode qubit 420 (FIG. 4) as discussed above. Assume further that the first superconducting multimode qubit coupler 740 is configured to have an A mode frequency $f_A$=4.0 GHz, and a B mode frequency $f_B$=5.72 GHz. With these exemplary operating parameters, computer simulations have indicated a longitudinal coupling as low as 0.004 kHz between the A mode (data mode) of the second superconducting multimode qubit 730 and the B mode of the first superconducting multimode qubit coupler 740, which is vanishingly small, and thereby significantly suppresses spectator effects.

It is to be appreciated that the exemplary quantum devices as discussed herein (e.g., FIG. 7) are configured to suppress spectator effects, e.g., suppress the static ZZ between a multimode qubit and a remote multimode qubit coupler. Essentially, the suppression of spectator effects is achieved because of the mode-selective exchange coupling between the multimode qubit couplers and the transmon qubits. Only the A modes of the multimode qubit couplers have exchange coupling to the transmon qubits, which prevents any exchange or longitudinal (ZZ) couplings among the B modes of the multimode qubit couplers connected to a particular transmon. This isolation subsequently prevents any exchange or longitudinal coupling between the B mode of given multimode qubit coupler and any mode of a spectator multimode qubit connected to another multimode qubit coupler.

Figure 8:
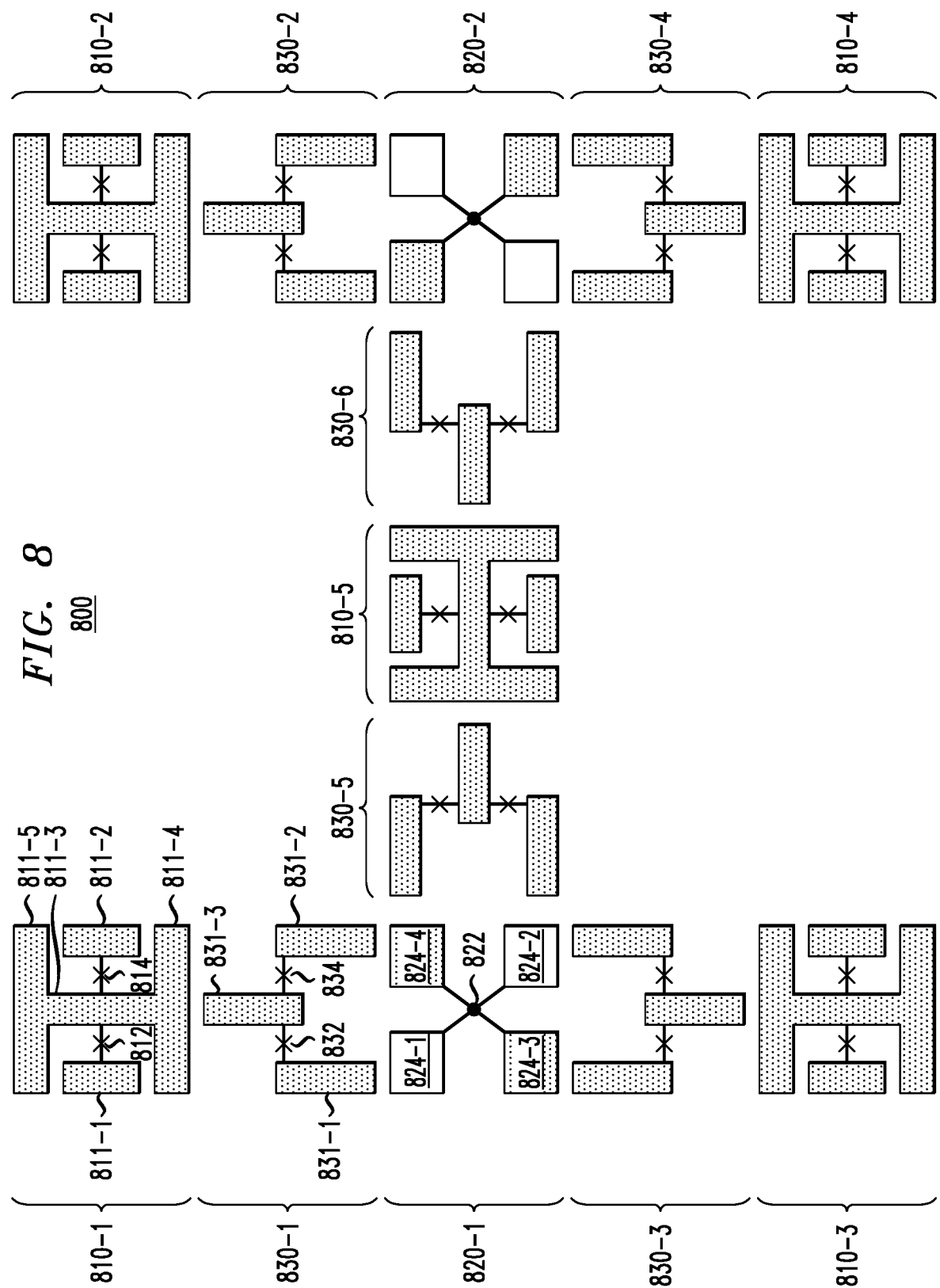
FIG. 8 schematically illustrates an array of superconducting quantum bits that are coupled by superconducting multimode quantum bit couplers, according to an exemplary embodiment of the disclosure.

While FIGS. 5 and 6 schematically illustrate planar superconducting quantum circuits 500 and 600 comprising two superconducting data qubits coupled by a superconducting multimode qubit coupler, it is to be understood that a superconducting quantum device, such as a quantum processor, can be implemented using an array of superconducting qubits comprising tens, hundreds, or thousands or more of coupled superconducting qubits, depending on the application. For example, FIG. 8 schematically illustrates an array of superconducting quantum bits that are coupled by superconducting multimode quantum bit coupler circuits, according to an exemplary embodiment of the disclosure. More specifically, FIG. 8 schematically illustrates a multi-qubit array 800 comprising a plurality of data qubits comprising superconducting multimode qubits 810-1, 810-2, 810-3, 810-4, and 810-5 and superconducting quadrupole transmon qubits 820-1 and 820-2, as well as a plurality of superconducting multimode qubit couplers 830-1, 830-2, 830-3, 830-4, 830-5, and 830-6. In the exemplary configuration of FIG. 8, the data qubits are directly capacitively coupled to the superconducting multimode qubit couplers 830-1, 830-2, 830-3, 830-4, 830-5, and 830-6 (without the use of separate superconducting coupling capacitors).

FIG. 8 illustrates an exemplary layout of a unit cell comprising a heavy hexagonal lattice structure, as is known in the art. The heavy hexagonal lattice layout is particularly suitable for superconducting qubit architectures to minimize frequency collisions and crosstalk between qubits (the term "heavy" describes the exemplary layout in which qubits are placed on both vertices and edges of a hexagonal lattice). In the exemplary embodiment of FIG. 8, the heavy hexagonal lattice structure is facilitated by the use of the superconducting quadrupole transmon qubits 820-1 and 820-2, wherein each superconducting quadrupole transmon qubit 820-1 and 820-2 allows dipole-dipole interaction and coupling with at least three superconducting multimode qubit couplers, such as shown.

As schematically illustrated in FIG. 8, the superconducting multimode qubits 810-1, 810-2, 810-3, 810-4, and 810-5 each comprise a layout which is similar to the exemplary layouts of the superconducting multimode qubits 520 and 620 as discussed above in conjunction with FIGS. 5 and 6. For example, as specifically shown in FIG. 8, the superconducting multimode qubit 810-1 comprises a first superconducting pad 811-1, a second superconducting pad 811-2, a third superconducting pad 811-3, a fourth superconducting pad 811-4, a fifth superconducting pad 811-5, a first Josephson tunnel junction device 812, and a second Josephson tunnel junction device 814. The superconducting pads 811-1, 811-2, 811-3, 811-4, and 811-5 comprise capacitor electrodes of coplanar parallel-plate capacitor structures which form the shunt capacitors of the superconducting multimode qubit 810-1, as discussed above.

In addition, the superconducting multimode qubit couplers 830-1, 830-2, 830-3, 830-4, 830-5, and 830-6 each comprise a layout which is similar to the superconducting multimode qubit couplers 530 and 630 as discussed above in conjunction with FIGS. 5 and 6. For example, as specifically shown in FIG. 8, the superconducting multimode qubit coupler 830-1 comprises a first superconducting pad 831-1, a second superconducting pad 831-2, a third superconducting pad 831-3, a first Josephson tunnel junction device 832, and a second Josephson tunnel junction device 834. The superconducting pads 831-1, 831-2, and 831-3 comprise capacitor electrodes of coplanar parallel-plate capacitor structures which form the shunt capacitors of the superconducting multimode qubit coupler 830-1, as discussed above. In addition, FIG. 8 schematically illustrates an exemplary embodiment of the superconducting multimode qubit coupler 830-1 in which an end portion of the superconducting pad 831-3 is directly capacitively coupled to the fourth superconducting pad 811-4 of the superconducting multimode qubit 810-1, without the use of an additional extended superconducting pad such as the fourth superconducting pad 631-4 shown in FIG. 6.

In the exemplary layout of FIG. 8, the B mode of the superconducting multimode qubit 810-1 is directly capacitively coupled to the B mode of the superconducting multimode qubit coupler 830-1. The B mode of the superconducting multimode qubit 810-2 is directly capacitively coupled to the B mode of the superconducting multimode qubit coupler 830-2. The B mode of the superconducting multimode qubit 810-3 is directly capacitively coupled to the B mode of the superconducting multimode qubit coupler 830-3. The B mode of the superconducting multimode qubit 810-4 is directly capacitively coupled to the B mode of the superconducting multimode qubit coupler 830-4. The B mode of the superconducting multimode qubit 810-5 is directly capacitively coupled to the B mode of the superconducting multimode qubit coupler 830-5 and to the B mode of the superconducting multimode qubit coupler 830-6.

As noted above, in the exemplary layout shown in FIG. 8, each superconducting quadrupole transmon qubit 820-1 and 820-2 is configured to enable dipole-dipole interaction with three superconducting tunable coupler qubits. The superconducting quadrupole transmon qubits 820-1 and 820-2 operate in a similar manner to the superconducting transmon qubits as shown in FIGS. 4, 5 and 6, except that the superconducting quadrupole transmon qubits 820-1 and 820-2 each comprise a different arrangement of the shunt capacitor pads, which have a quadrupole charge pattern when excited. For example, as illustrated in FIG. 8, the superconducting quadrupole transmon qubit 820-1 comprises a single Josephson tunnel junction device 822, having a Manhattan Josephson junction framework, and first, second, third, and fourth superconducting pads 824-1, 824-2, 824-3, and 824-4, which collectively comprise capacitor electrode pads that form a shunt capacitor of the superconducting quadrupole transmon qubit 820-1.

The first, second, third, and fourth superconducting pads 824-1, 824-2, 824-3, and 824-4 of the superconducting quadrupole transmon qubit 820-1 are arranged in a rectangular array. The first and second superconducting pads 824-1 and 824-2 are configured to implement a first capacitor electrode of the shunt capacitor, and are commonly connected to a first electrode of the single Josephson tunnel junction device 822. The third and fourth superconducting pads 824-3 and 824-4 are configured to implement a second capacitor electrode of the shunt capacitor, and are commonly connected to a second electrode of the single Josephson tunnel junction device 822. With the exemplary quadrupole configuration, as shown in FIG. 8, the superconducting quadrupole transmon qubit 820-1 is configured to capacitively couple directly to the A mode of each of the three superconducting multimode qubit couplers 830-1, 830-3, and 830-5. For example, the first superconducting pad 831-1 and the second superconducting pad 832-2 of the superconducting multimode qubit coupler 830-1 are directly capacitively coupled to the first superconducting pad 824-1 and the fourth superconducting pad 824-4, respectively, of the superconducting quadrupole transmon qubit 820-1.

As noted above, the heavy hexagonal lattice structure of the multi-qubit array 800 shown in FIG. 8 is facilitated by the use of the superconducting quadrupole transmon qubits 820-1 and 820-2, since each superconducting quadrupole transmon qubit can be coupled to three superconducting tunable coupler qubits to implement the unit cell layout of the multi-qubit array 800, which comprises seven (7) superconducting data qubits. It is to be understood that a larger multiqubit array can be implemented by adding one more heavy hexagonal unit cells to the array shown in FIG. 8. For example, in some embodiments, the multi-qubit array 800 can be expanded by coupling (B mode coupling) one or more of the superconducting multimode qubits 810-1, 810-2, 810-3, and 810-4 to a respective superconducting multimode qubit coupler to expand the heavy hexagonal lattice structure. In other exemplary embodiments, the multi-qubit array 800 can be expanded by coupling (A mode coupling) an additional superconducting multimode qubit coupler to each of the superconducting quadrupole transmon qubits 820-1 and 820-2 to expand the lattice structure, in which case, each superconducting quadrupole transmon qubit 820-1 and 820-2 would be coupled to four (4) superconducting multimode qubit couplers to implement heavy square lattice.

As is known in the art, calibration procedures are periodically performed on a quantum system such as a quantum processor to calibrate various quantum elements such as readout resonators, data qubits, and coupler circuitry, etc., to enable high-fidelity gate operations (e.g., single-qubit gate operations and entanglement gate operations). For example, various types of in-situ calibration procedures are periodically performed to, e.g., determine the resonant frequencies of readout resonators, determine the transition frequencies of qubits, determine coherence times ($T_1$) of the qubits (where the coherence time $T_1$ of a given qubit denotes the time it takes for the qubit state to decay from the excited state to the ground state), determine transverse relaxation times ($T_2$) of the qubits (or dephasing time, decoherence time of a qubit along the X-Y plane of the Bloch sphere), calibrate control pulses that are applied to qubits to perform single-qubit gate operations, calibrate control pulses that are applied to active coupler circuits to perform entanglement gate operations, etc. The calibration procedures result in the determining various control parameters that are maintained in a calibration database and periodically updated on the order of seconds, minutes, hours, days, etc., as needed, depending on the type of quantum element and the operating characteristics of the quantum computing system, and other factors as is understood by those of ordinary skill in the art.

Exemplary embodiments of the disclosure include techniques for calibrating two-qubit gate operations for superconducting qubits that are coupled by a superconducting multimode qubit coupler. For example, in some embodiments, as noted above, a two-qubit entanglement gate operation (e.g., CPHASE gate) is performed for data qubits that are coupled to a superconducting multimode qubit coupler by driving the B mode of the superconducting multimode qubit coupler using a control pulse that is properly calibrated to cause the data qubits to undergo a state-dependent Stark shifting (which is equivalent to a microwave-activated ZZ), to thereby cause a conditional Z-axis rotation of the data qubits, depending on the states of the data qubits.

As part of the two-qubit gate calibration process, the shape and amplitude of the control pulse is calibrated to drive the B mode of the superconducting multimode qubit coupler through a full $2\pi$ rotation, e.g., from the ground state $|0\rangle$ to the first excited state $|1\rangle$, and back to the ground state $|0\rangle$. In addition, the calibration process comprises iteratively adjusting a detuning of the control pulse to ensure that a desired conditional Z rotation is achieved for the data qubits, while obtaining the full $2\pi$ rotation of the B mode of the superconducting multimode qubit coupler. When calibrating control pulses, it is desirable to utilize control pulses with short durations and sufficient amplitudes in order to perform gate operations that are sufficiently faster than the finite coherence times of the qubits. However, short pulses (e.g., square wave pulses) which turn on and off too fast typically include unwanted spectral components which can excite higher qubit states, e.g., second excited state $|2\rangle$ and higher, which can lead to low fidelity gate operations. For example, the increased spectral width of fast pulses can excite an $f_{12}$ transition, causing errors.

In this regard, various pulse shaping techniques can be utilized to calibrate precise pulses shapes which provide the desired spectral components that drive the transition between the ground state $|0\rangle$ and first excited state $|1\rangle$, while suppressing unwanted spectral components that drive transitions to and between higher states. For example, shaped pulses such as Gaussian pulses, cosine pulses (e.g., sum of half cosines), or hyperbolic secant pulses, can be utilized to drive $f_{01}$ transitions, while suppressing $f_{12}$ and higher transitions. Essentially, such pulse shaping techniques suppress/reduce the transients associated with turning the control pulse on and off. In addition, pulse-shaping techniques include DRAG (derivative removal by adiabatic gate) correction pulses, which can be used in conjunction with shaped pulses (such as Gaussian pulses, cosine pulses, or hyperbolic secant pulses) to further suppress unwanted state transitions, while maintaining a same pulse envelope area (or integral of pulse envelope). A DRAG correction technique essentially superimposes a fine-tuned out-of-phase component with the main control pulse, which has an envelope that is a derivative of the main control pulse, and which is configured to further suppress $f_{12}$ and higher transitions.

Exemplary techniques for calibrating two-qubit gate operations for superconducting qubits that are coupled by a superconducting multimode qubit coupler, will now be discussed in further detail in conjunction with FIGS. 9, and 10A-10I. In some embodiments, a two-qubit gate calibration process comprises calibrating a hyperbolic secant pulse with DRAG correction to drive a superconducting coupler (e.g., superconducting multimode qubit coupler) to perform an entanglement gate operation (e.g., CPHASE gate) between two superconducting qubits (e.g., a superconducting transmon qubit and a superconducting multimode qubit) that are coupled to the superconducting coupler.

More specifically, in an exemplary embodiment, an analog control pulse, A(t), with a hyperbolic secant pulse shape with DRAG correction is defined as follows:

$$A(t) = A_0 \mathrm{sech}\left(\frac{t}{\sigma}\right) - A_1\left(\frac{A_0}{\sigma}\right)\frac{\sinh\left(\frac{t}{\sigma}\right)}{\left[\cosh\left(\frac{t}{\sigma}\right)\right]^2},$$

where $A_0$ denotes the amplitude of the hyperbolic secant pulse envelope, where $\sigma$ is a measure of a transition time of the pulse, and where $A_1$ denotes an amplitude of the DRAG correction pulse. In this embodiment, the DRAG correction pulse comprises a pulse envelope that is proportional to a time-derivative of the hyperbolic secant pulse, which is superimposed on the hyperbolic secant pulse to suppress unwanted transitions. In some embodiments, the hyperbolic secant pulse is utilized since such pulse shape can produce high fidelity $2\pi$ rotations of qubits for a broad range of detuning between the pulse frequency and the qubit frequency. In other embodiments, a control pulse can be implemented with a pulse envelope that is generated using a sum of half cosines, which is robust over a wide range of detuning and works best for longer gate times. In other embodiments, a standard Gaussian pulse with DRAG correction can be utilized in circumstances where there is sufficiently strong coupling between the data qubits and the coupler mode.

Figure 9:
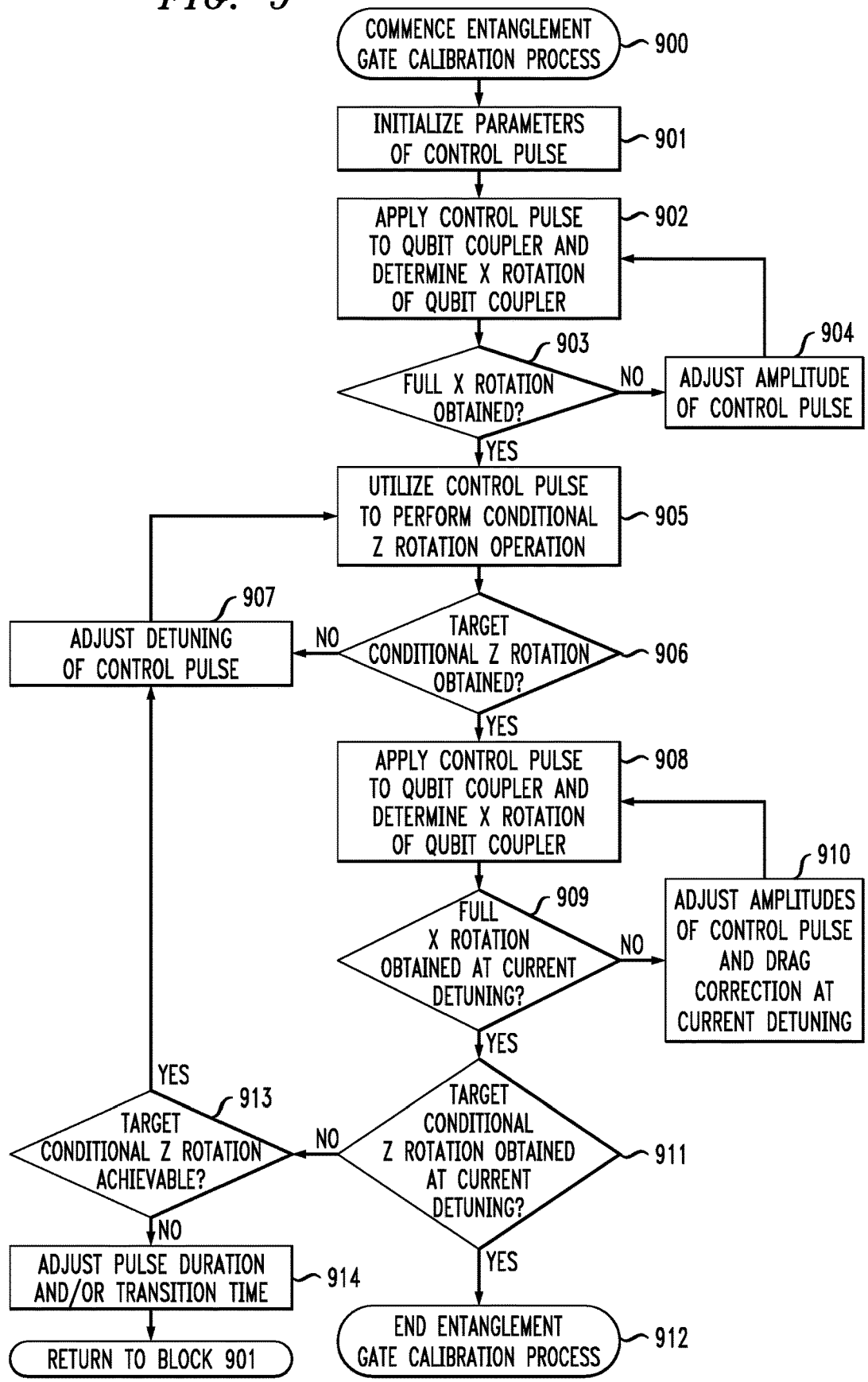
FIG. 9 illustrates a flow diagram of a method for calibrating an entanglement gate operation for superconducting quantum bits that are coupled by a superconducting multimode qubit coupler, according to an exemplary embodiment of the disclosure.

Referring now to FIG. 9, a flow diagram illustrates a method for calibrating an entanglement gate operation for superconducting quantum bits that are coupled by a superconducting multimode qubit coupler, according to an exemplary embodiment of the disclosure. An initial step comprises commencing an entanglement gate calibration process at an appropriate stage of an overall calibration process (block 900). For example, as noted above, a calibration process involves different stages of calibration with respect to, e.g., calibrating readout resonators, quantum bits, couplers, etc. In some embodiments, the entanglement gate calibration process is commenced following, e.g., the calibration stages that are performed to determine the resonant frequencies of the readout resonators that are coupled to the data qubits and qubit couplers, and to determine the transition frequencies of the data qubits and qubit couplers, etc. It is to be noted that the entanglement gate calibration process of FIG. 9 is performed for each two-qubit gate circuit within the quantum system because each two-qubit gate circuit has different operating frequencies and characteristics, such that the control parameters will vary between the different two-qubit gate circuits. For ease of explanation, the process flow of FIG. 9 will be described in the context of a single two-qubit gate circuit, although it is to be understood that the same entanglement gate calibration process would be applied to each two-qubit gate circuit within the quantum system.

An initial step of the entanglement gate calibration process comprises initializing the parameters of a control pulse, and generating and applying the initial control pulse to a target multimode qubit coupler (block 901). For example, in an exemplary embodiment in which the control pulse comprises a hyperbolic secant pulse with DRAG correction, the parameters $A_0$, $\sigma$, $A_1$, pulse duration, and frequency are set to initial values. It is to be noted that the control pulse for a given superconducting multimode qubit coupler can be generated using known arbitrary waveform generation (AWG) techniques which implement IQ amplitude modulation. In particular, an exemplary AWG system comprises a baseband signal generator, digital-to-analog converter (DAC) stage, an IQ modulation stage, and a phase-locked loop system to generate local oscillator (LO) signals (e.g., quadrature LO signals LO_I and LO_Q) for the IQ modulation stage.

The baseband signal generator generates a digital baseband signal (e.g., a digital IQ signal) under software control of the gate calibration process, wherein the digital baseband signal is generated based on the target parameters for generating an analog control pulse. The DAC stage converts the digital baseband signal to an analog baseband signal (e.g., analog baseband signals I(t) and Q(t)) having a baseband frequency. In particular, the DAC stage operates as an envelope generator to the analog IQ envelope pulses (e.g., I(t) and Q(t)) which comprise the hyperbolic secant pulse shape and the superimposed DRAG correction pulse shape. The analog IQ signals are filtered and applied to the IQ signal modulation stage. The IQ modulation stage performs amplitude modulation by modulating a quadrature LO signal (e.g., an in-phase LO signal (LO_I) and a quadrature-phase LO signal (LO_Q)) with the analog IQ signals to generate a modulated analog control signal which comprises the analog control pulse that is used to drive the superconducting multimode qubit coupler.

For the first calibration process where no previous calibrated pulse was generated, the amplitude parameter $A_1$ (for DRAG correction pulse envelope) can be initialized to $A_1=0$, and the amplitude parameter $A_0$ (for the hyperbolic secant pulse envelope) can be selected based on known operating characteristics of the hardware circuitry that generates and applies the control pulse to the superconducting multimode qubit coupler (e.g., the amount of signal attenuation applied along the RF path to the control input of the superconducting multimode qubit coupler, the operating characteristics of the IQ mixers of the IQ modulation stage, the amplitude/strength of the LO signals, etc.). In addition, the parameter a and pulse duration are initially set to target values which define the initial control pulse length. In addition, the LO frequency is set to a frequency that is near the B mode frequency of the superconducting multimode qubit coupler for the given two-qubit gate to be calibrated. It is to be noted that for the current calibration process, where a previous calibration process was performed to calibrate a gate control pulse, the current calibration process can utilize some or all of the previously calibrated control pulse parameters as the initial parameters.

The current control pulse is applied to drive the B mode of the given superconducting multimode qubit coupler, and the state of the B mode of the given superconducting multimode qubit coupler is measured to determine the amount of X rotation obtained in response to the applied control pulse (block 902). At this stage of the entanglement gate calibration process, it is desired to achieve a full $2\pi$ rotation of the B mode about the X-axis of the Block sphere (i.e., a transition from the ground state |0⟩ to the first excited state |1⟩ and back to the ground state |0⟩). In some embodiments, the process (block 902) is performed hundreds or thousands of times for the current control pulse, to determine whether a full $2\pi$ rotation of the B mode is achieved with high probability, based on the probability information derived from the collection of measured states. For each iteration, the B mode of the superconducting multimode qubit coupler is initialized to the ground state |0⟩, the current control pulse is applied to drive the B mode, and the B mode state is measured via, e.g., readout system.

If it is determined that a full $2\pi$ rotation of the B mode is not obtained for the current control pulse (negative result in block 903), the software calibration control process proceeds to recalibrate the control pulse by adjusting the amplitude $A_0$ of the hyperbolic secant pulse envelope as needed to obtain a full $2\pi$ rotation (block 904). The iterative process (blocks 902, 903, and 904) is then repeated for each recalibrated control pulse over a range of amplitude $A_0$ values, until a full $2\pi$ rotation of the B mode of the given superconducting multimode qubit couple is obtained (affirmative result in block 903) in response to a given control pulse with given amplitude $A_0$ value.

Once the amplitude $A_0$ of the control pulse is properly calibrated to a obtain a full $2\pi$ rotation of the state of the B mode of the given superconducting multimode qubit coupler (affirmative result in block 903), the current control pulse is utilized to drive the B mode of the given superconducting multimode qubit coupler to perform a conditional Z rotation operation for the data qubits which are coupled to the given superconducting multimode qubit coupler (block 905), and the resulting states of the data qubits are measured to determine if a target conditional Z rotation is obtained in response to the current control pulse (block 906).

In some embodiments, a process for performing a conditional Z rotation gate operation and measuring the conditional Z rotation of the data qubits is performed by a process which comprises multiple iterations of (i) selecting one data qubit (e.g., superconducting multimode qubit) as a "target" qubit $Q_0$, and selecting the other data qubit (e.g., superconducting transmon qubit) as a "control" qubit $Q_1$, (ii) placing the target qubit $Q_0$ in a ground state |0⟩, first excited state |1⟩, or an even superposition state, (iii) placing the control qubit $Q_1$ in a ground state |0⟩ or first excited state |1⟩, (iv) applying the control pulse to drive the B mode of the superconducting multimode qubit coupler, and (v) performing, e.g., a Ramsey experiment to measure the results of the conditional Z rotation achieved. For a proper CPHASE gate operation, if both data qubits are in excited states, then both data qubits will have a Z rotation in response to the CPHASE gate operation (e.g., $\pi$ rotation), otherwise, both data qubits will have no Z rotation as a result of the CPHASE gate operation.

At the completion of the process in blocks 905 and 906, if it is determined that the target conditional Z rotation of the data qubits is not achieved as a result of driving B mode of the superconducting multimode qubit coupler with the current control pulse (negative result in block 906), the calibration control process proceeds to adjust a "detuning" of the control pulse (block 907). In particular, the term "detuning" denotes a difference between the frequency of the control pulse and the B mode frequency of the superconducting multimode qubit coupler. In some embodiments, detuning is performed by incrementally adjusting the LO frequency that is applied to the IQ modulation stage to generate a control pulse with a recalibrated frequency that is detuned from the B mode frequency of the superconducting multimode qubit coupler. The iterative process (blocks 905, 906, and 907) is then repeated for each recalibrated control pulse over a detuning range until the desired conditional Z rotation of the data qubits is achieved as a result of driving B mode of the superconducting multimode qubit coupler with a sufficiently detuned control pulse (affirmative result in block 906).

Once the detuning of the control pulse is sufficiently calibrated to obtain the target conditional Z rotation of the data qubits, the current control pulse is applied to drive the B mode of the given superconducting multimode qubit coupler, and the state of the B mode of the given superconducting multimode qubit coupler is measured to determine the amount of X-axis rotation obtained in response to the applied control pulse (block 908). At this stage of the entanglement gate calibration process, it is desired to achieve a full $2\pi$ rotation of the B mode about the X-axis of the Block sphere with the newly detuned control pulse. If it is determined that a full $2\pi$ X-axis rotation of the B mode is not obtained with the currently detuned control pulse (negative result in block 909), the software calibration control process proceeds to recalibrate the control pulse by adjusting the amplitude $A_0$ of the hyperbolic secant pulse envelope and the amplitude $A_1$ of the DRAG correction pulse, as needed, to achieve a full $2\pi$ X-axis rotation with the currently detuned control pulse (block 910). The iterative process (blocks 908, 909, and 910) is repeated for each recalibrated control pulse over a range of $A_0$ and $A_1$ amplitude values, until a full $2\pi$ X-axis rotation of the B mode of the given superconducting multimode qubit coupler is obtained using the control pulse with the recalibrated amplitudes $A_0$ and $A_1$ and the current detuning (affirmative result in block 909).

Once the amplitudes $A_0$ and $A_1$ of the control pulse are properly calibrated at the current detuning to a obtain a full $2\pi$ rotation of the B mode of the given superconducting multimode qubit coupler, the new amplitude calibrated control pulse is utilized to drive the B mode of the given superconducting multimode qubit coupler to perform a conditional Z rotation operation, and the resulting states of the data qubits are measured to determine if the target conditional Z rotation is obtained in response to the new amplitude calibrated control pulse with the current detuning (block 911). At this point in the entanglement gate calibration process, if the target conditional Z rotation is obtained in response to the new amplitude calibrated control pulse with the current detuning (affirmative result in block 911), the entanglement gate calibration process is deemed complete and terminates (block 912).

On the other hand, if the target conditional Z rotation is not obtained in response to the new amplitude calibrated control pulse with the current detuning (negative result in block 911), and if obtaining the target conditional Z rotation is deemed to be achievable through further iterations of recalibrating the detuning and amplitudes of the control pulse (affirmative determination in block 913), the gate calibration process proceeds to recalibrate the detuning of the control pulse (return to block 907). Thereafter, the iterative process of blocks 905, 906, 907, 908, 909, 910, and 911 is repeated with the goal of obtaining a sufficiently calibrated control pulse in which both (i) the full $2\pi$ X-axis rotation of the B mode of the superconducting multimode qubit coupler and (ii) the target conditional Z rotation of the data qubits, are obtained with errors that that are below prespecified error threshold values.

At some point in the entanglement gate calibration process, if it is determined that the target conditional Z rotation of the data qubits is not achievable (negative determination in block 913), the gate calibration control process proceeds to recalibrate the control pulse by adjusting the pulse duration and/or pulse transition time a (block 914), and the entanglement gate calibration process is repeated (return to block 901). For example, in some embodiments, it may be determined (in block 913) that the target conditional Z rotation of the data qubits is not achievable after the completion of many iterations of adjusting the amplitudes $A_0$ and $A_1$ and detuning of the control pulse, without a sufficient convergence toward minimizing the errors below the prespecified error threshold values.

It is to be appreciated that the entanglement gate calibration process of FIG. 9 provides a precise and efficient method for calibrating a control pulse for two-qubit conditional gate operation. Indeed, since the superconducting multimode qubit coupler comprises an anharmonic mode (e.g., anharmonic B mode), the calibration process can be configured to separately calibrate the control pulse shape to cause the multimode qubit coupler to go through full $2\pi$ X-axis rotation with high accuracy, regardless of the detuning between the control pulse and the mode frequency (e.g., B mode frequency) of the multimode qubit coupler. The pulse detuning is then calibrated separately to achieve a desired conditional Z rotation of the data qubits. The process of iteratively repeating the separate detuning and amplitude calibration stages allows the entanglement gate calibration process to progressively achieve higher fidelity.

FIGS. 10A, 10B, 10C, 10D, 10E, 10F, 10G, 10H, and 10I depict time-dependent numerical simulation results of an exemplary entanglement gate calibration process that is evaluated using a control pulse that is calibrated based on the process of FIG. 9, according to an exemplary embodiment of the disclosure. In particular, FIGS. 10A-10I illustrate results of computer simulations of an entablement gate calibration process (e.g., two-qubit gate) for an exemplary system comprising a superconducting transmon qubit and a superconducting multimode qubit, which are coupled by a superconducting multimode qubit coupler (such as shown in FIG. 4). For the simulation results, the transmon qubit was designated as the control qubit. In addition, the computer simulations were performed using the exemplary parameters as discussed above, wherein the superconducting transmon qubit was set to have a transition frequency $f_Q$=4.29 GHz, the superconducting multimode qubit was set to have an A mode frequency $f_A$=4.2 GHz, and a B mode frequency $f_B$=5.54 GHz, and the superconducting multimode qubit coupler was set to have an A mode frequency $f_A$=4.1 GHz, and a B mode frequency $f_B$=5.82 GHz. It is to be understood that the computer simulation results shown in FIGS. 10A-10I are presented for the purpose of illustrating aspects of an exemplary entanglement gate calibration process, and should not be construed in any limiting manner with regard to the scope of the claimed subject matter.

Figure 10A:
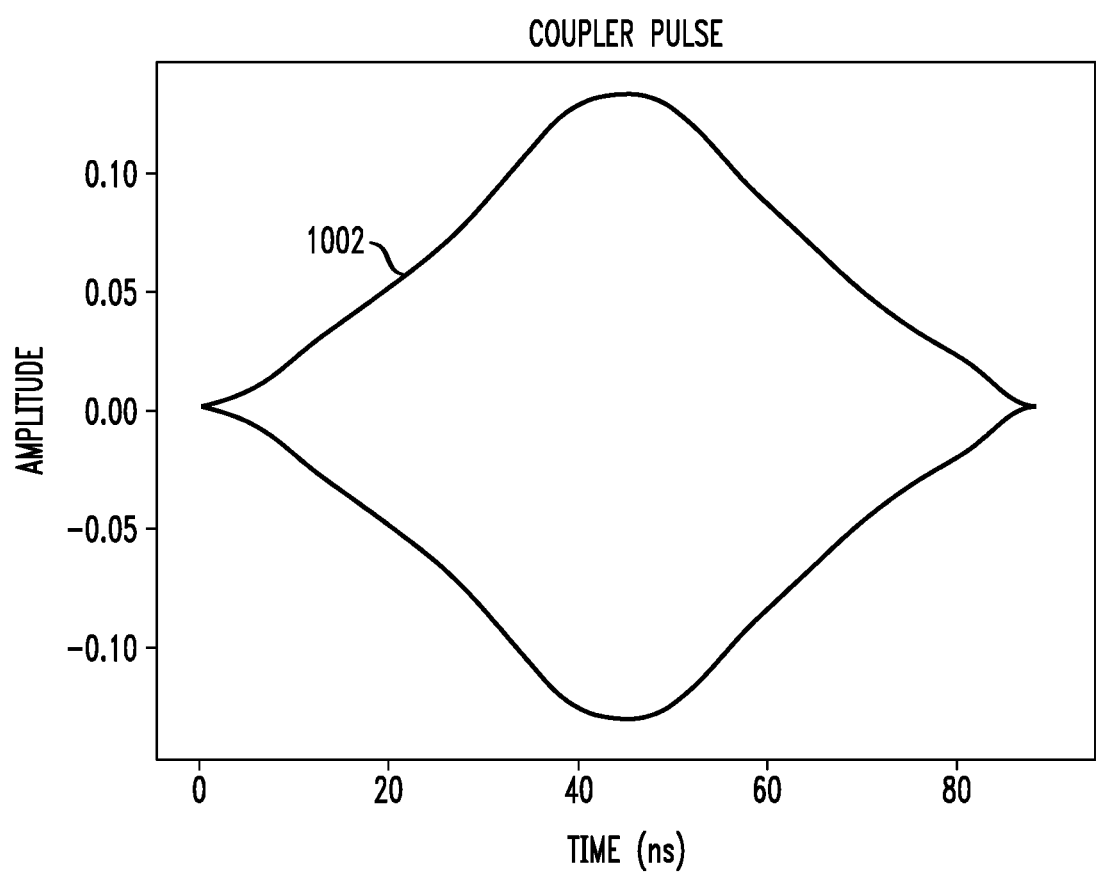

FIG. 10A comprises a waveform diagram 1000 of calibrated control pulse which is generated using an entanglement gate calibration process, according to an exemplary embodiment of the disclosure. In particular, FIG. 10A illustrates an exemplary pulse envelope 1002 of a calibrated control pulse having a pulse duration of 90 nanoseconds (ns), an amplitude $A_0$=0.13342 (arb units), a DRAG correction $A_1$=−3 (unitless), $\sigma$=15 ns, and a detuning=−5.2 MHz. For ease of illustration, FIG. 10A illustrates the pulse envelope representing the amplitude modulated envelope (Y-axis) of Rabi oscillations over a time period (X-axis) from 0 ns to 90 ns, while omitting the actual illustration of the Rabi oscillations which would otherwise not be discernible at the pulse frequency of the calibrated control pulse. FIG. 10A illustrates an exemplary calibrated control pulse that is utilized to drive the B mode of the superconducting multimode qubit coupler to perform a two-qubit entangle gate operation (e.g., CPHASE gate).

Figure 10B:
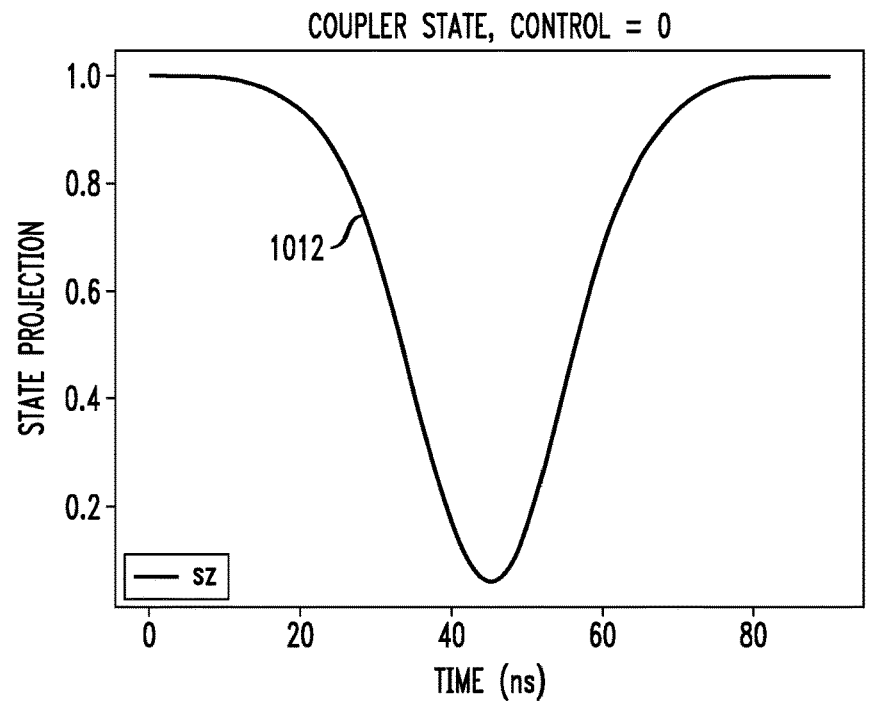
Figure 10C:
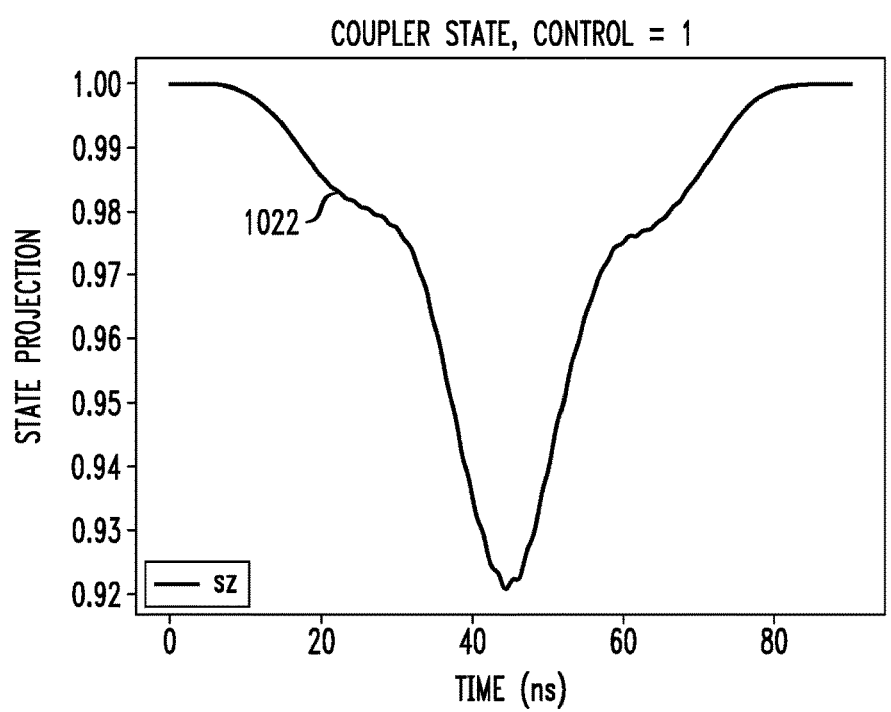

FIGS. 10B and 10C are timing diagrams which illustrate a state projection (along the Z axis of the Bloch sphere) of the B mode of the superconducting multimode qubit coupler for different states of the control qubit, according to an exemplary embodiment of the disclosure. In particular, FIG. 10B is a timing diagram 1010 which shows a curve 1012 that represents a state projection of the B mode of the superconducting multimode qubit coupler over a time duration (0 ns to 90 ns) of the calibrated control pulse driving the B mode of the superconducting multimode qubit coupler, with the control qubit (e.g., superconducting transmon qubit) in the ground state $|0\rangle$. Further, FIG. 10C is a timing diagram 1020 which shows a curve 1022 that represents a state projection of the B mode of the superconducting multimode qubit coupler over the time duration (0 ns to 90 ns) of the calibrated control pulse driving the B mode of the superconducting multimode qubit coupler, with the control qubit (e.g., superconducting transmon qubit) in the first excited state $|1\rangle$.

In FIGS. 10B and 10C, the y-axis represents values of the state projection (along the Z-axis of the Bloch sphere) of the B mode of the superconducting multimode qubit coupler, wherein a state projection=1.0 denotes the ground state of the B mode, wherein a state projection=−1.0 denotes the first excited state of the B mode, and wherein a state projection=0 denotes an even superposition state of the ground and first excited states. The simulation results shown in FIGS. 10B and 10C were obtained by placing the target qubit (e.g., superconducting multimode qubit) in an even superposition of the ground state and the first excited state, and placing the control qubit (e.g., superconducting transmon qubit) in either the ground state $|0\rangle$ or the first excited state $|1\rangle$, and applying the calibrated control pulse to the B mode of the superconducting multimode qubit coupler to evaluate the ability of the calibrated control pulse to drive the B mode of the coupler through a full $2\pi$ rotation (e.g., from ground state $|0\rangle$ to the first excited state $|1\rangle$, and back to the ground state $|0\rangle$). FIGS. 10B and 10C show that while the superconducting multimode qubit coupler transitions through different paths depending on the state of the control qubit, the B mode returns back to the ground state.

Figure 10D:
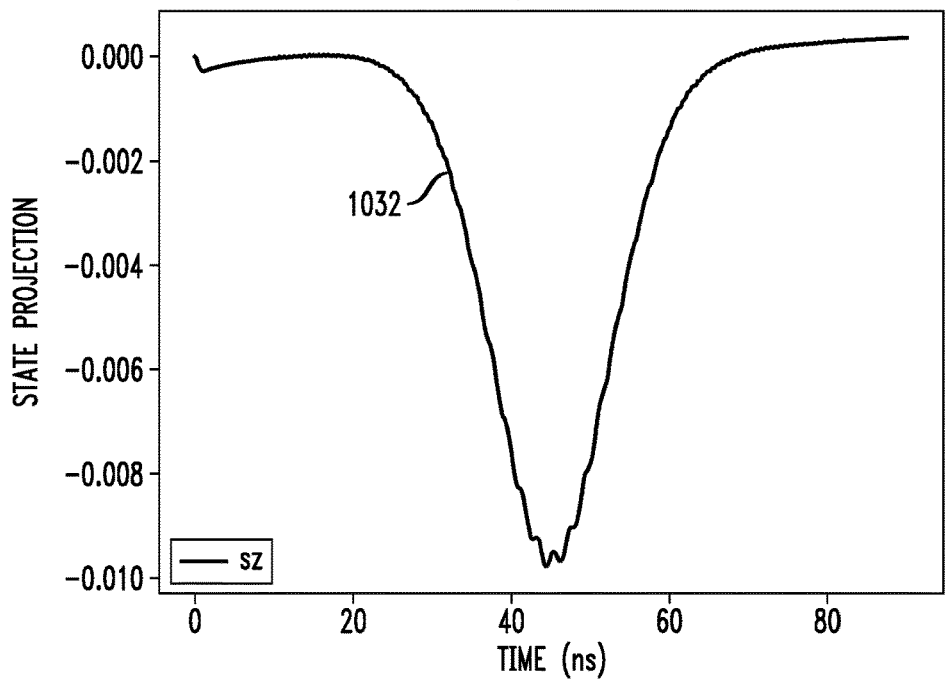
Figure 10E:
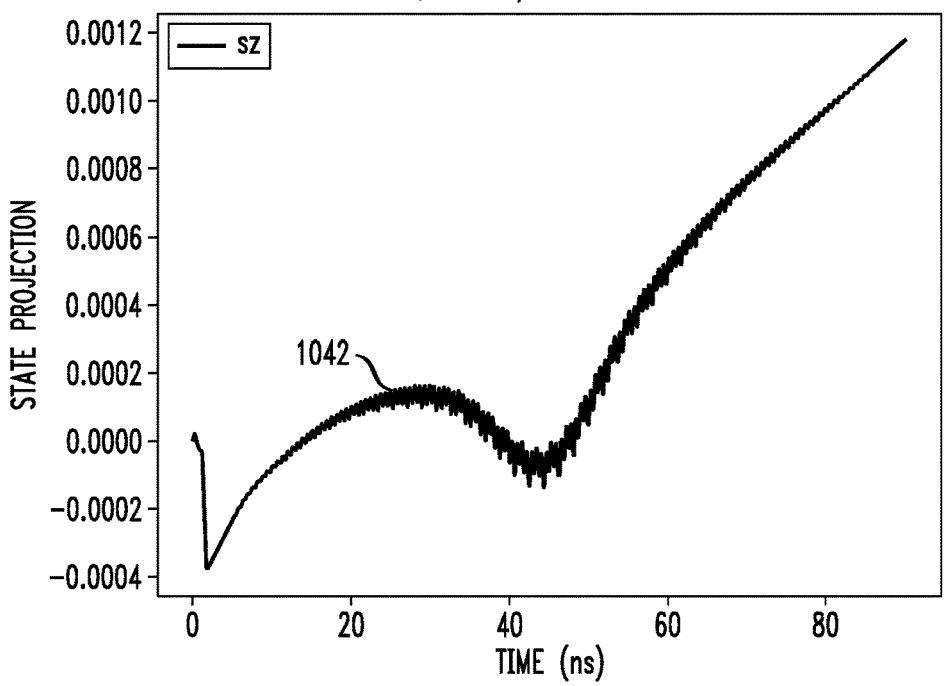

Next, FIGS. 10D, 10E, 10F, and 10G are timing diagrams which illustrate state projections (along the Z axis of the Bloch sphere) of the data qubits coupled to the superconducting multimode qubit coupler, which result from driving the B mode of the superconducting multimode qubit coupler with the calibrated control pulse for different states of the control qubit, according to an exemplary embodiment of the disclosure. In particular, FIG. 10D is a timing diagram 1030 which shows a curve 1032 that represents a state projection (along the Z axis of the Bloch sphere) of the target qubit Q0 (e.g., superconducting multimode qubit) over the time duration (0 ns to 90 ns) of the calibrated control pulse driving the B mode of the superconducting multimode qubit coupler, with the control qubit Q1 (e.g., superconducting transmon qubit) in the ground state $|0\rangle$. Further, FIG. 10E is a timing diagram 1040 which shows a curve 1042 that represents a state projection (along the Z axis of the Bloch sphere) of the target qubit Q0 over the time duration (0 ns to 90 ns) of the calibrated control pulse driving the B mode of the superconducting multimode qubit coupler, with the control qubit Q1 in the first excited state $|1\rangle$.

Figure 10F:
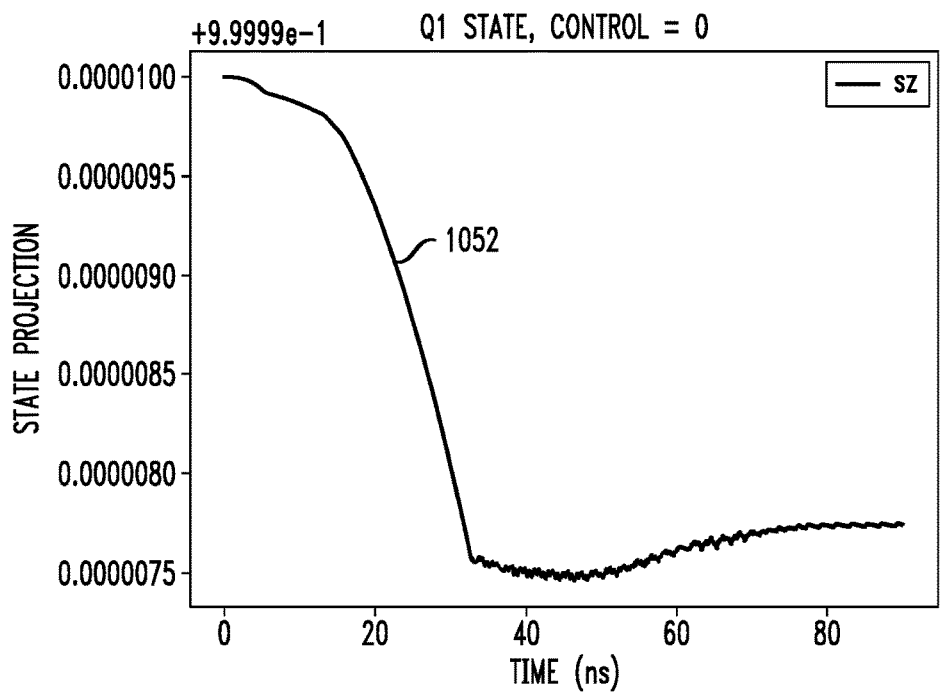
Figure 10G:
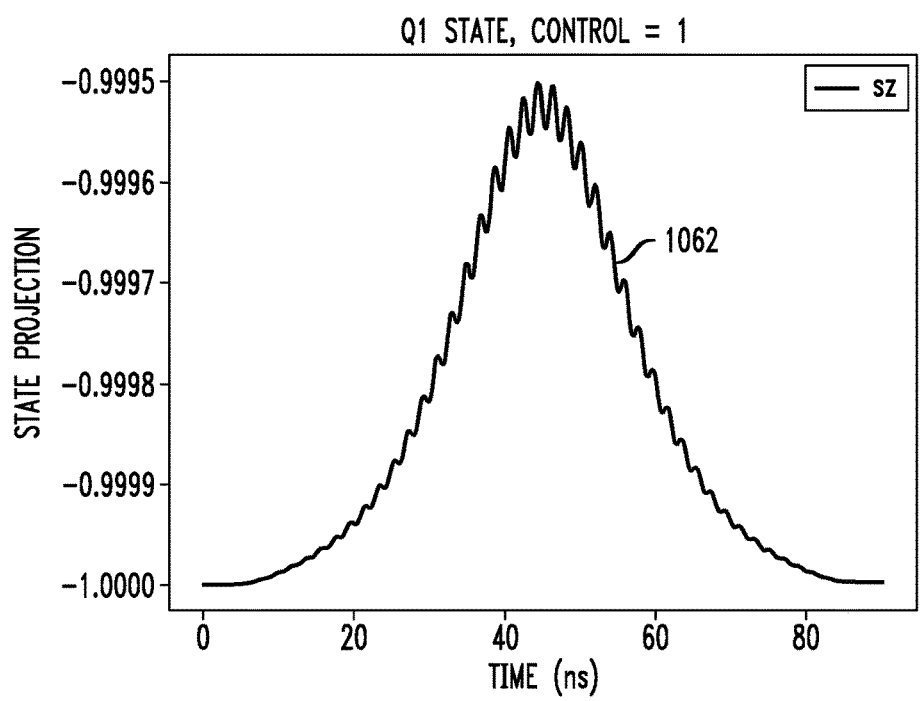

Similarly, FIG. 10F is a timing diagram 1050 which shows a curve 1052 that represents a state projection (along the Z axis of the Bloch sphere) of the control qubit Q1 over the time duration (0 ns to 90 ns) of the calibrated control pulse driving the B mode of the superconducting multimode qubit coupler, with the control qubit Q1 in the ground state $|0\rangle$. Further, FIG. 10G is a timing diagram 1060 which shows a curve 1062 that represents a state projection (along the Z axis of the Bloch sphere) of the control qubit Q1 over the time duration (0 ns to 90 ns) of the calibrated control pulse driving the B mode of the superconducting multimode qubit coupler, with the control qubit Q1 in the first excited state $|1\rangle$.

The simulation results of the state projections as shown in FIGS. 10D, 10E, 10F, and 10G illustrate that in each case, the data qubits Q0 and Q1 end up close to their starting states, when driving the B mode of the superconducting multimode qubit coupler with the calibrated control pulse, which are desired results. Indeed, when performing a conditional Z gate operation, there should be no X or Y rotations of the data qubits, as the phase of the data qubits should only be changed when both data qubits are in excited states.

Figure 10H:
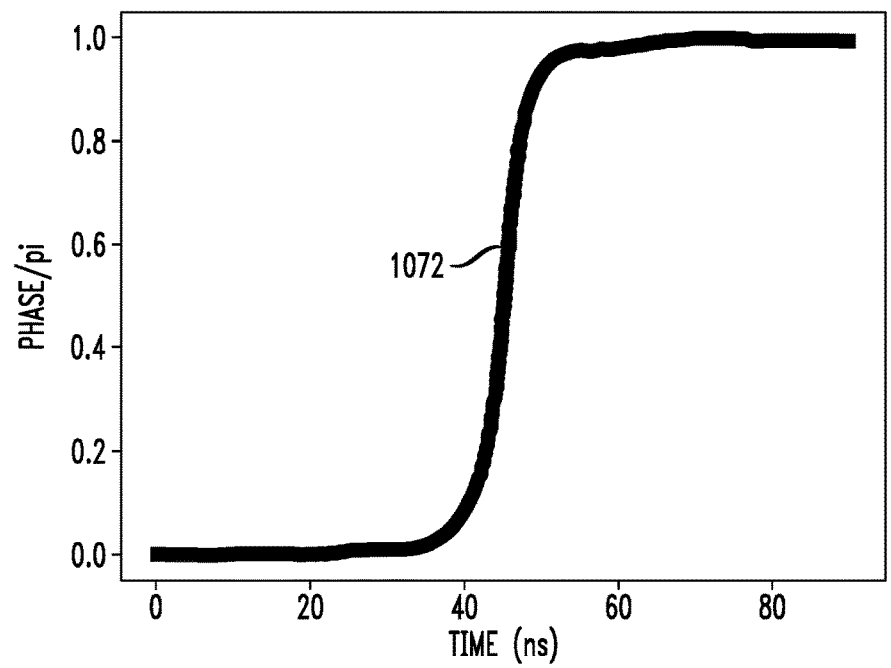

Next, FIG. 10H is a timing diagram 1070 which illustrates a curve 1072 that represents a conditional Z rotation that is obtained for the target qubit bit in response to driving the B mode of the superconducting multimode qubit coupler with the calibrated control pulse, according to an exemplary embodiment of the disclosure. The conditional Z rotation can be measured by calculating X and Y state projections of the target qubit Q0 over time, which allows one to determine how the phase of the target qubit Q0 evolves in time as it undergoes precession around the equator (e.g., X-Y plane) of the Bloch sphere. We subtract the phase of the target qubit Q0 during the gate operation with the control qubit Q1 in either its ground state or first excited state. This difference is the conditional Z rotation, which is shown in FIG. 10H over the time period 90 nanoseconds of the control pulse. The simulation results in FIG. 10H show that a conditional Z rotation of $\pi$ radians can be achieved over the time period 90 nanoseconds of the calibrated control pulse, which is sufficient for a maximum entangling gate.

Figure 10I:
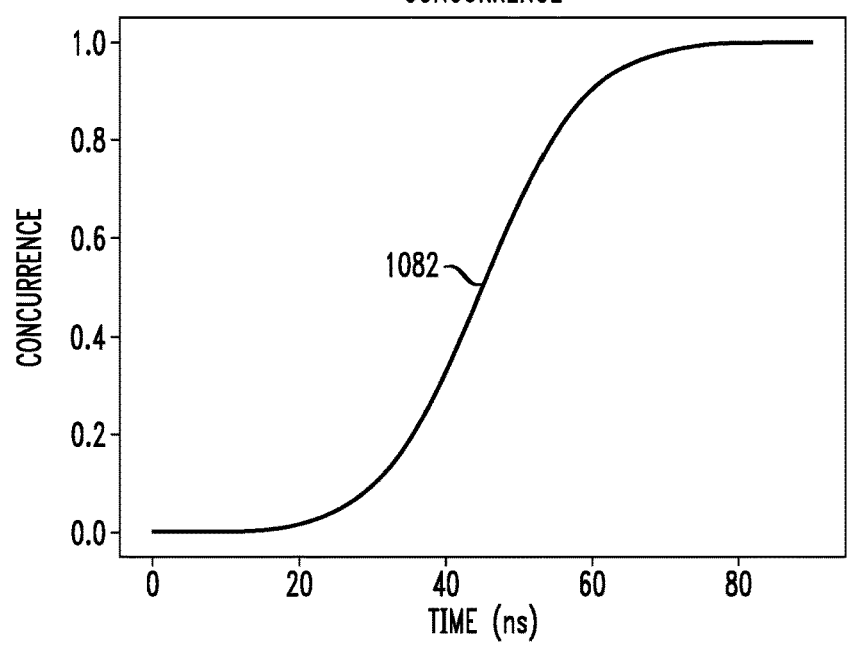

Next, FIG. 10I is a timing diagram 1080 which illustrates a curve 1082 that represents a concurrence of an amount of entanglement that is obtained when the superconducting multimode qubit coupler is driven with the calibrated control pulse to perform an entanglement gate operation, according to an exemplary embodiment of the disclosure. The concurrence of the system is calculated to evaluate the amount of entanglement and obtain an upper bound on gate fidelity. A concurrence value of 1 indicates a maximum entanglement, while a deviation from the concurrence value of 1 indicates either an incomplete entanglement or leakage from the computational basis. For the simulation, the target and control qubits Q0 and Q1 were placed in an even superposition of their ground and first excited states, and the concurrence was determined over the time period of the calibrated control pulse. The simulation results shown in FIG. 10I illustrate a final concurrence of 0.9998, indicating a high-fidelity entangling gate operation.

Figure 11:
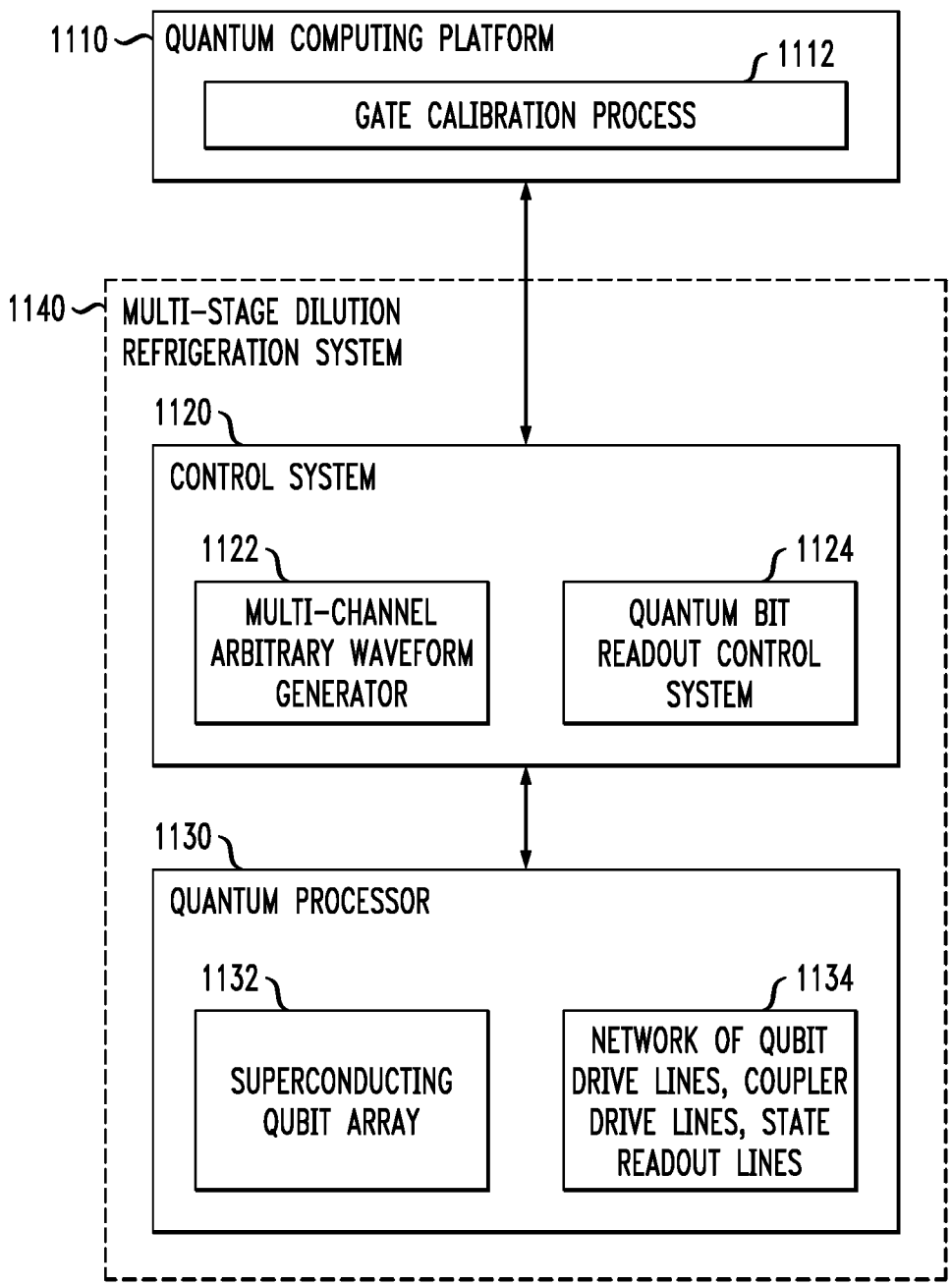
FIG. 11 schematically illustrates a quantum computing system, according to an exemplary embodiment of the disclosure.

FIG. 11 schematically illustrates a quantum computing system, according to an exemplary embodiment of the disclosure. In particular, FIG. 11 schematically illustrates a quantum computing system 1100 which comprises a quantum computing platform 1110, a control system 1120, and a quantum processor 1130. In some embodiments, the quantum computing platform 1110 implements software control programs such as a gate calibration process 1112 which is configured to perform, e.g., an entanglement gate calibration process to calibrate two-qubit gate systems implemented by the quantum processor 1130, as well as perform other calibration operations as discussed above in conjunction with FIG. 9. In addition, in some embodiments, the control system 1120 comprises a multi-channel arbitrary waveform generator 1122, and a quantum bit readout control system 1124. The quantum processor 1130 comprises a solid-state semiconductor chip having a superconducting qubit array 1132 and a network 1134 of qubit drive lines, coupler drive lines, and qubit state readout lines, and other circuit QED components that may be needed for a given application or quantum system configuration.

In some embodiments, the control system 1120 and the quantum processor 1130 are disposed in a dilution refrigeration system 1140 which can generate cryogenic temperatures that are sufficient to operate components of the control system 1120 for quantum computing applications. For example, the quantum processor 1130 may need to be cooled down to near-absolute zero, e.g., 10-15 millikelvin (mK), to allow the superconducting qubits to exhibit quantum behaviors. In some embodiments, the dilution refrigeration system 1140 comprises a multi-stage dilution refrigerator where the components of the control system 1120 can be maintained at different cryogenic temperatures, as needed. For example, while the quantum processor 1130 may need to be cooled down to, e.g., 10-15 mK, the circuit components of the control system 1120 may be operated at cryogenic temperatures greater than 10-15 mK (e.g., cryogenic temperatures in a range of 3K-4K), depending on the configuration of the quantum computing system.

In some embodiments, the superconducting qubit array 1132 comprises a plurality of superconducting transmon qubits and superconducting tunable coupler qubits, in which each pair of superconducting qubits is connected by a respective superconducting qubit coupler, using techniques as discussed herein. For example, in some embodiments, the superconducting qubit array 1132 implements the multi-qubit array 800 of FIG. 8. As noted above, the superconducting qubit couplers are configured to control interactions between spatially separated pairs of superconducting qubits to implement entanglement gate operations. The number of superconducting qubits of the qubit array 1132 can be on the order of tens, hundreds, thousands, or more, etc.

The network 1134 of qubit drive lines, coupler drive lines, and qubit state readout lines, etc., are configured to apply microwave control signals to superconducting qubits and coupler circuitry in the superconducting qubit array 1132 to perform various types of gate operations, e.g., single-gate operations, entanglement gate operations (e.g., CPHASE gate operation), etc., as well read the quantum states of the superconducting qubits. More specifically, as noted above, microwave control pulses are applied to the qubit drive lines of respective superconducting qubits to change the quantum state of the superconducting qubits (e.g., change the quantum state of a given qubit between the ground state and excited state, or to a superposition state). In particular, as noted above, the qubit drive line for a given superconducting qubit is utilized to modify the state of the given superconducting qubit by applying a microwave drive pulse with a center frequency that matches the operating frequency of the given superconducting qubit. In addition, calibrated control pulses are applied to the coupler drive lines to perform entanglement gate operations between pairs of coupled superconducting qubits, when executing certain quantum information processing algorithm.

Furthermore, as noted above, the state readout lines comprise readout resonators that are coupled to respective superconducting qubits. The state of a given superconducting qubit can be determined through microwave transmission measurements made between readout ports of the readout resonator. The states of the superconducting qubits are read out after executing a quantum algorithm. In some embodiments, a dispersive readout operation is performed in which a change in the resonant frequency of a given readout resonator, which is coupled to a given superconducting qubit, is utilized to readout the state (e.g., ground or excited state) of the given superconducting qubit.

The network 1134 of qubit drive lines, coupler drive lines, and qubit state readout lines, etc., is coupled to the control system 1120 through a suitable hardware input/output (I/O) interface, which couples I/O signals between the control system 1120 and the quantum processor 1130. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 1122 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 1122 comprises a plurality of AWG channels, which control respective superconducting qubits within the superconducting qubit array 1132 of the quantum processor 1130. In some embodiments, each AWG channel comprises a baseband signal generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 1122 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to the filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout control system 1124 comprises a microwave pulse signal generator that is configured to apply a microwave tone to a given readout resonator line of a given superconducting qubit to perform a readout operation to readout the state of the given superconducting qubit, as well as circuitry that is configured to process the readout signal generated by the readout resonator line to determine the state of the given superconducting qubit, using techniques known to those of ordinary skill in the art.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application.

Figure 12:
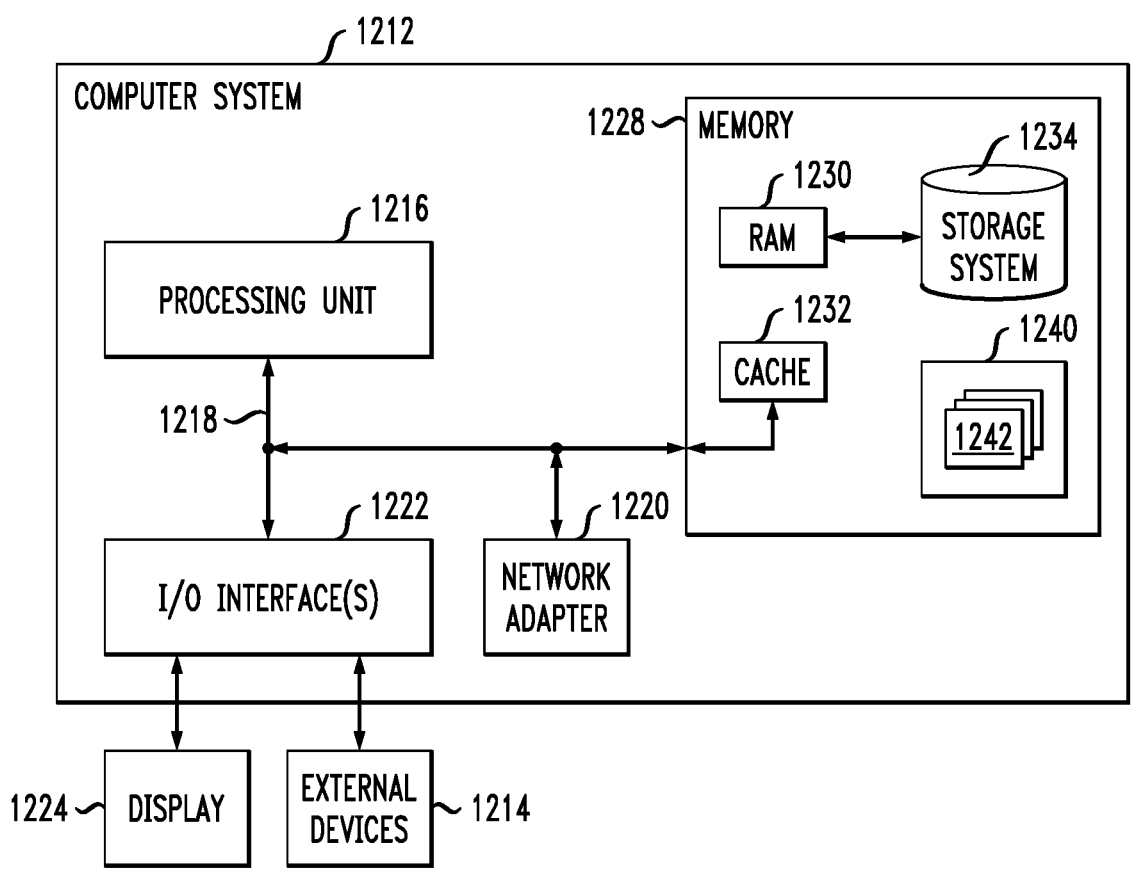
FIG. 12 schematically illustrates an exemplary architecture of a computing node which can host a quantum computing platform, according to an exemplary embodiment of the disclosure.

In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations as discussed herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform various operations as discussed herein.

The computer readable program instructions may be provided to a processor of a computer, or other programmable data processing apparatus to produce a machine, such that the instructions, which execute via the processor of the computer or other programmable data processing apparatus, create means for implementing the functions/acts as discussed herein. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement the exemplary computing operations as discussed herein.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts as discussed herein.

The block diagrams in the Figures illustrate the architecture, functionality, and operation of possible implementations of systems, methods, and computer program products according to various embodiments of the present invention. In this regard, each block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and combinations of blocks in the block diagrams, can be implemented by special purpose hardware-based systems that perform the specified functions or acts or carry out combinations of special purpose hardware and computer instructions.

These concepts are illustrated with reference to FIG. 12 which schematically illustrates an exemplary architecture of a computing node which can host a quantum computing platform, according to an exemplary embodiment of the disclosure. For example, FIG. 12 schematically illustrates an exemplary architecture of a computing node 1200 which can host the quantum computing platform 1110 (FIG. 11), according to an exemplary embodiment of the disclosure. More specifically, FIG. 12 illustrates a computing node 1200 which comprises a computer system/server 1212, which is operational with numerous other general purpose or special purpose computing system environments or configurations. Examples of well-known computing systems, environments, and/or configurations that may be suitable for use with computer system/server 1212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1212 may be practiced in distributed cloud computing environments where tasks are performed by remote processing devices that are linked through a communications network. In a distributed cloud computing environment, program modules may be located in both local and remote computer system storage media including memory storage devices.

In FIG. 12, computer system/server 1212 in computing node 1200 is shown in the form of a general-purpose computing device. The components of computer system/server 1212 may include, but are not limited to, one or more processors or processing units 1216, a system memory 1228, and a bus 1218 that couples various system components including system memory 1228 to the processors 1216.

The bus 1218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1212 typically includes a variety of computer system readable media. Such media may be any available media that is accessible by computer system/server 1212, and it includes both volatile and non-volatile media, removable and non-removable media.

The system memory 1228 can include computer system readable media in the form of volatile memory, such as random-access memory (RAM) 1230 and/or cache memory 1232. The computer system/server 1212 may further include other removable/non-removable, volatile/nonvolatile computer system storage media. By way of example only, storage system 1234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1218 by one or more data media interfaces. As depicted and described herein, memory 1228 may include at least one program product having a set (e.g., at least one) of program modules that are configured to carry out the functions of embodiments of the invention.

The program/utility 1240, having a set (at least one) of program modules 1242, may be stored in memory 1228 by way of example, and not limitation, as well as an operating system, one or more application programs, other program modules, and program data. Each of the operating system, one or more application programs, other program modules, and program data or some combination thereof, may include an implementation of a networking environment. Program modules 1242 generally carry out the functions and/or methodologies of embodiments of the disclosure as described herein.

Computer system/server 1212 may also communicate with one or more external devices 1214 such as a keyboard, a pointing device, a display 1224, etc., one or more devices that enable a user to interact with computer system/server 1212, and/or any devices (e.g., network card, modem, etc.) that enable computer system/server 1212 to communicate with one or more other computing devices. Such communication can occur via Input/Output (I/O) interfaces 1222. Still yet, computer system/server 1212 can communicate with one or more networks such as a local area network (LAN), a general wide area network (WAN), and/or a public network (e.g., the Internet) via network adapter 1220. As depicted, network adapter 1220 communicates with the other components of computer system/server 1212 via bus 1218. It should be understood that although not shown, other hardware and/or software components could be used in conjunction with computer system/server 1212. Examples, include, but are not limited to: microcode, device drivers, redundant processing units, external disk drive arrays, RAID systems, SSD drives, and data archival storage systems, etc.

In some embodiments, the quantum computing system 1100 of FIG. 11 can be implemented in the cloud (quantum computing as a service (QaaS)) to provide quantum compute facilities as an on-demand service. While this disclosure includes a detailed description on cloud computing, implementation of the teachings recited herein are not limited to a cloud computing environment. Rather, embodiments of the disclosure can be implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 13:
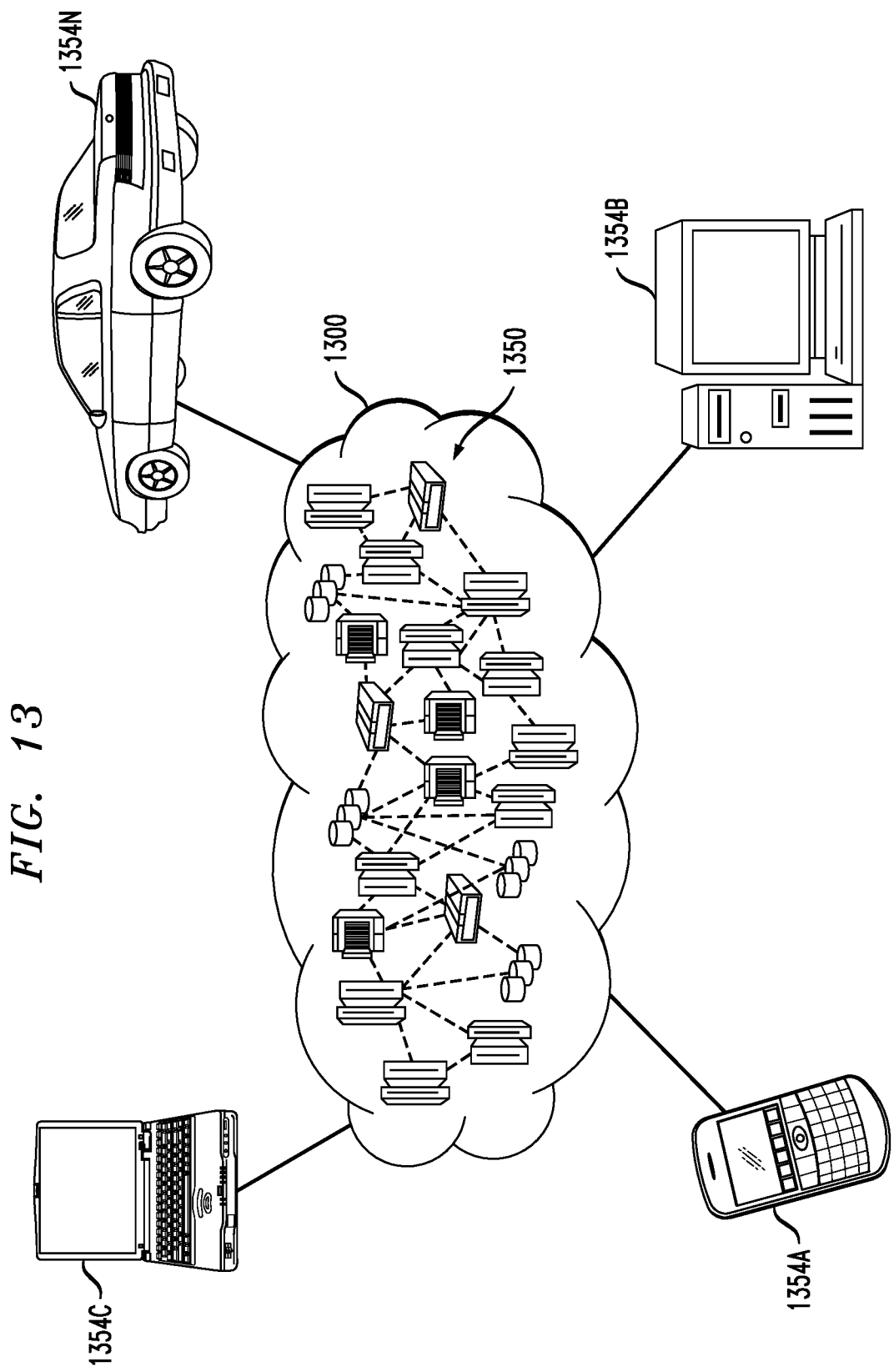
FIG. 13 depicts a cloud computing environment according to an exemplary embodiment of the disclosure.

Referring now to FIG. 13, illustrative cloud computing environment 1300 is depicted. As shown, cloud computing environment 1300 includes one or more cloud computing nodes 1350 with which local computing devices used by cloud consumers, such as, for example, personal digital assistant (PDA) or cellular telephone 1354A, desktop computer 1354B, laptop computer 1354C, and/or automobile computer system 1354N may communicate. Nodes 1350 may communicate with one another. They may be grouped (not shown) physically or virtually, in one or more networks, such as Private, Community, Public, or Hybrid clouds as described hereinabove, or a combination thereof. This allows cloud computing environment 1300 to offer infrastructure, platforms and/or software as services for which a cloud consumer does not need to maintain resources on a local computing device. It is understood that the types of computing devices 1354A-N shown in FIG. 13 are intended to be illustrative only and that computing nodes 1350 and cloud computing environment 1300 can communicate with any type of computerized device over any type of network and/or network addressable connection (e.g., using a web browser).

Figure 14:
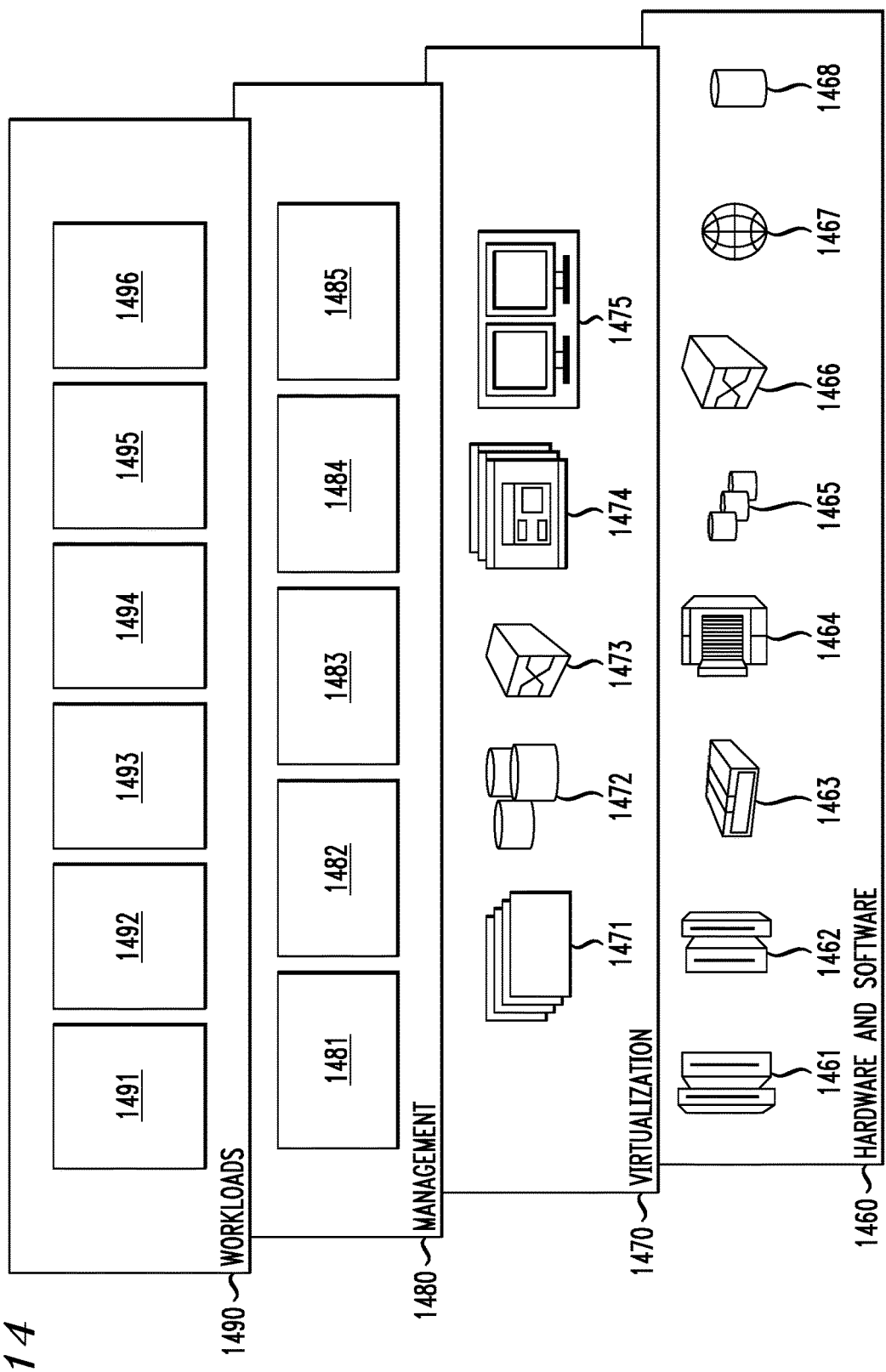
FIG. 14 depicts abstraction model layers according to an exemplary embodiment of the disclosure.

Referring now to FIG. 14, a set of functional abstraction layers provided by cloud computing environment 1300 (FIG. 13) is shown. It should be understood in advance that the components, layers, and functions shown in FIG. 14 are intended to be illustrative only and embodiments of the invention are not limited thereto. As depicted, the following layers and corresponding functions are provided:

Hardware and software layer 1460 includes hardware and software components. Examples of hardware components include: mainframes 1461; RISC (Reduced Instruction Set Computer) architecture based servers 1462; servers 1463; blade servers 1464; storage devices 1465; and networks and networking components 1466. In some embodiments, software components include network application server software 1467 and database software 1468.

Virtualization layer 1470 provides an abstraction layer from which the following examples of virtual entities may be provided: virtual servers 1471; virtual storage 1472; virtual networks 1473, including virtual private networks; virtual applications and operating systems 1474; and virtual clients 1475.

In one example, management layer 1480 may provide the functions described below. Resource provisioning 1481 provides dynamic procurement of computing resources and other resources that are utilized to perform tasks within the cloud computing environment. Metering and Pricing 1482 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1483 provides access to the cloud computing environment for consumers and system administrators. Service level management 1484 provides cloud computing resource allocation and management such that required service levels are met. Service Level Agreement (SLA) planning and fulfillment 1485 provide pre-arrangement for, and procurement of, cloud computing resources for which a future requirement is anticipated in accordance with an SLA.

Workloads layer 1490 provides examples of functionality for which the cloud computing environment may be utilized. Examples of workloads and functions which may be provided from this layer include: mapping and navigation 1491; software development and lifecycle management 1492; virtual classroom education delivery 1493; data analytics processing 1494; transaction processing 1495; and various functions 1496 for implementing a quantum computing platform of a quantum computing system, such as discussed herein in conjunction with FIG. 11. In some embodiments, the hardware and software layer 1460 would include, e.g., various software and hardware systems of, e.g., the quantum computing system 1100 (FIG. 11) as discussed herein, to implement or otherwise support the various workloads and functions 1496 for performing, e.g., quantum computing operations and executing quantum computing applications.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first superconducting quantum bit;
   a second superconducting quantum bit comprising a first mode and a second mode, wherein the first mode is configured to store quantum data; and
   a superconducting quantum bit coupler which is coupled between the first superconducting quantum bit and the second superconducting quantum bit;
   wherein the superconducting quantum bit coupler comprises a first mode and a second mode, and is configured to operate in one of a first state and a second state in response to a control signal applied to the superconducting quantum bit coupler;
   wherein in the first state of the superconducting quantum bit coupler, the first superconducting quantum bit is exchange coupled to the first mode of the superconducting quantum bit coupler, and the second mode of the second superconducting quantum bit is exchange coupled to the second mode of the superconducting quantum bit coupler, to suppress interaction between the first superconducting quantum bit and the first mode of the second superconducting quantum bit; and
   wherein in the second state of the superconducting quantum bit coupler, the first superconducting quantum bit and the first mode of the second superconducting quantum bit are exchange coupled to both the first mode and the second mode of the superconducting quantum bit coupler, to enable interaction between the first superconducting quantum bit and the first mode of the second superconducting quantum bit and perform an entanglement gate operation in response to the control signal applied to the superconducting quantum bit coupler.

2. The device of claim 1, wherein the control signal is configured to drive the second mode of the superconducting quantum bit coupler to perform the entanglement gate operation.

3. The device of claim 1, wherein the control signal is configured to drive the second mode of the superconducting quantum bit coupler through a rotation from a ground state, to a first excited state, and back to the ground state, to perform the entanglement gate operation.

4. The device of claim 1, wherein in the first state, the second mode of the superconducting quantum bit coupler is in a ground state with no control signal applied to the superconducting quantum bit coupler.

5. The device of claim 1, wherein the first superconducting quantum bit comprises a superconducting transmon quantum bit.

6. The device of claim 5, wherein the superconducting transmon quantum bit comprises superconducting quadrupole transmon quantum bit.

7. The device of claim 1, wherein the superconducting quantum bit coupler comprises:
   a first superconducting pad;
   a second superconducting pad;
   a third superconducting pad, disposed between the first superconducting pad and the second superconducting pad;
   a first superconducting tunnel junction device coupled to and between the first superconducting pad and the third superconducting pad; and
   a second superconducting tunnel junction device coupled to and between the second superconducting pad and the third superconducting pad.

8. The device of claim 7, wherein:
   the first superconducting quantum bit comprises:
      a first node coupled to the first superconducting pad of the superconducting quantum bit coupler; and
      a second node coupled to the second superconducting pad of the superconducting quantum bit coupler; and
   the second superconducting quantum bit comprises:
      a first superconducting pad;
      a second superconducting pad;
      a third superconducting pad, disposed between the first superconducting pad and the second superconducting pad;
      a first superconducting tunnel junction device coupled to and between the first superconducting pad and the third superconducting pad; and a second superconducting tunnel junction device coupled to and between the second superconducting pad and the third superconducting pad;

wherein the third superconducting pad of the second superconducting quantum bit is coupled to the third superconducting pad of the superconducting quantum bit coupler.

9. A system, comprising;

a quantum processor comprising an array of superconducting quantum bits; and a control system configured to generate control signals to control the quantum processor;

wherein the array of superconducting quantum bits comprises:

a first superconducting quantum bit;

a second superconducting quantum bit comprising a first mode and a second mode, wherein the first mode is configured to store quantum data; and a superconducting quantum bit coupler which is coupled between the first superconducting quantum bit and the second superconducting quantum bit;

wherein the superconducting quantum bit coupler comprises a first mode and a second mode, and is configured to operate in one of a first state and a second state in response to a control signal applied to the superconducting quantum bit coupler;

wherein in the first state of the superconducting quantum bit coupler, the first superconducting quantum bit is exchange coupled to the first mode of the superconducting quantum bit coupler, and the second mode of the second superconducting quantum bit is exchange coupled to the second mode of the superconducting quantum bit coupler, to suppress interaction between the first superconducting quantum bit and the first mode of the second superconducting quantum bit; and wherein in the second state of the superconducting quantum bit coupler, the first superconducting quantum bit and the first mode of the second superconducting quantum bit are exchange coupled to both the first mode and the second mode of the superconducting quantum bit coupler, to enable interaction between the first superconducting quantum bit and the first mode of the second superconducting quantum bit and perform an entanglement gate operation in response to the control signal applied to the superconducting quantum bit coupler.

10. The system of claim 9, wherein:

the control signal is configured to drive the second mode of the superconducting quantum bit coupler through a rotation from a ground state, to a first excited state, and back to the ground state, to perform the entanglement gate operation; and in the first state, the second mode of the superconducting quantum bit coupler is in a ground state with no control signal applied to the superconducting quantum bit coupler.

11. The system of claim 9, wherein the first superconducting quantum bit comprises a superconducting transmon quantum bit.

12. The system of claim 9, wherein:

the first superconducting quantum bit comprises a superconducting quadrupole transmon quantum bit; and the array of superconducting quantum bits further comprises:

a second superconducting quantum bit coupler coupled to the superconducting quadrupole transmon quantum bit;

a third superconducting quantum bit coupler coupled to the superconducting quadrupole transmon quantum bit;

a third superconducting quantum bit coupled to the second superconducting quantum bit coupler; and a fourth superconducting quantum bit coupled to the third superconducting quantum bit coupler.

13. The system of claim 9, wherein the array of superconducting quantum bits comprises a hexagonal lattice structure.

14. The system of claim 9, wherein the superconducting quantum bit coupler comprises:

a first superconducting pad;

a second superconducting pad;

a third superconducting pad, disposed between the first superconducting pad and the second superconducting pad;

a first superconducting tunnel junction device coupled to and between the first superconducting pad and the third superconducting pad; and a second superconducting tunnel junction device coupled to and between the second superconducting pad and the third superconducting pad.

15. The system of claim 14, wherein:

the first superconducting quantum bit comprises:

a first node coupled to the first superconducting pad of the superconducting quantum bit coupler; and a second node coupled to the second superconducting pad of the superconducting quantum bit coupler; and the second superconducting quantum bit comprises:

a first superconducting pad;

a second superconducting pad;

a third superconducting pad, disposed between the first superconducting pad and the second superconducting pad;

a first superconducting tunnel junction device coupled to and between the first superconducting pad and the third superconducting pad; and a second superconducting tunnel junction device coupled to and between the second superconducting pad and the third superconducting pad;

wherein the third superconducting pad of the second superconducting quantum bit is coupled to the third superconducting pad of the superconducting quantum bit coupler.

16. A computer program product for calibrating an entanglement gate process, the computer program product comprising:

one or more computer readable storage media, and program instructions collectively stored on the one or more computer readable storage media, the program instructions comprising:

program instructions to calibrate parameters of a control pulse that is configured to control operation of a superconducting quantum bit coupler to perform an entanglement gate operation between a first superconducting quantum bit and a second superconducting quantum bit, which are coupled to the superconducting quantum bit coupler;

wherein the program instructions to calibrate the parameters of a control pulse comprise program instructions to perform an iterative process comprising one or more iterations of:

performing an amplitude calibration process to calibrate an amplitude of the control pulse to cause the superconducting quantum bit coupler to rotate from a ground state, to a first excited state, and back to the ground state, in response to applying the control pulse with the calibrated amplitude to the superconducting quantum bit coupler; and performing a frequency detuning calibration process to calibrate a detuning of a frequency of the control pulse with respect to an operating frequency of the superconducting quantum bit coupler, to achieve a target conditional rotation of the first superconducting quantum bit and the second superconducting quantum bit, in response to applying the control pulse with the calibrated amplitude and calibrated frequency detuning, to the superconducting quantum bit coupler.

17. The computer program product of claim 16, wherein the program instructions for performing an amplitude calibration process comprise program instructions to calibrate an amplitude of a hyperbolic secant pulse.

18. The computer program product of claim 16, wherein the program instructions for performing an amplitude calibration process comprise program instructions to calibrate an amplitude of a hyperbolic secant pulse and an amplitude of a derivative removal by adiabatic gate correction pulse that is superimposed on the hyperbolic secant pulse.

19. The computer program product of claim 16, wherein the superconducting quantum bit coupler comprises a first mode and a second mode, and wherein the calibrated control pulse is applied to the second mode of the superconducting quantum bit coupler to calibrate the entanglement gate operation.

20. The computer program product of claim 16, wherein the program instructions to calibrate the parameters of the control pulse further comprise:

program instructions to determine whether the target conditional rotation of the first superconducting quantum bit and the second superconducting quantum bit can be achieved with further iterations of the amplitude calibration process and the frequency detuning calibration process; and program instructions for adjusting at least one of a pulse duration and pulse transition time of the control pulse, and repeating the iterative process, in response to determining that the target conditional rotation is not achievable.

\* \* \* \* \*